US007080365B2

(12) United States Patent
Broughton et al.

(10) Patent No.: US 7,080,365 B2
(45) Date of Patent: Jul. 18, 2006

(54) METHOD AND APPARATUS FOR SIMULATION SYSTEM COMPILER

(75) Inventors: Jeffrey M. Broughton, Palo Alto, CA (US); Liang T. Chen, Saratoga, CA (US); William kwei-cheung Lam, Newark, CA (US); Derek E. Pappas, Union City, CA (US); Ihao Chen, San Jose, CA (US); Thomas M. McWilliams, Menlo Park, CA (US); Ankur Narang, New Delhi (IN); Jeffrey B. Rubin, Pleasanton, CA (US); Earl T. Cohen, Fremont, CA (US); Michael W. Parkin, Palo Alto, CA (US); Ashley N. Saulsbury, Los Gatos, CA (US); Michael S. Ball, La Mesa, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 651 days.

(21) Appl. No.: 10/113,582

(22) Filed: Mar. 29, 2002

(65) Prior Publication Data

US 2003/0188299 A1  Oct. 2, 2003

Related U.S. Application Data

(60) Provisional application No. 60/313,762, filed on Aug. 20, 2001, provisional application No. 60/313,217, filed on Aug. 17, 2001.

(51) Int. Cl.
*G06F 9/45* (2006.01)

(52) U.S. Cl. .............................. 717/146; 716/1; 703/15
(58) Field of Classification Search .................. 714/49; 717/149, 124, 152, 146, 161, 131; 703/15, 703/16, 26; 716/1; 715/771, 762
See application file for complete search history.

(56) References Cited

U.S. PATENT DOCUMENTS

| 4,885,684 | A | | 12/1989 | Austin et al. |
| 5,274,818 | A | | 12/1993 | Vasilevsky et al. |
| 5,960,171 | A | * | 9/1999 | Rotman et al. ............... 714/49 |
| 6,421,808 | B1 | * | 7/2002 | McGeer et al. ................ 716/1 |
| 2004/0019883 | A1 | * | 1/2004 | Banerjee et al. ............ 717/152 |

FOREIGN PATENT DOCUMENTS

EP    1 107 116 A2    6/2001

OTHER PUBLICATIONS

Yu-Kwong Kwok and Ishfaq Ahmad; "*Dynamic Critical-Path Scheduling: An Effective Technique for Allocating Task Graphs to Multiprocessors*;" May 1996, pp. 506-521; vol. 7, No. 5, IEEE Transactions On Parallel and Distributed Systems.

(Continued)

*Primary Examiner*—Tuan Dam
*Assistant Examiner*—Chih-Ching chow
(74) *Attorney, Agent, or Firm*—Osha Liang LLP

(57) ABSTRACT

A method for compiling a cycle-based design involves generating a parsed cycle-based design from the cycle-based design, elaborating the parsed cycle-based design to an annotated syntax tree, translating the annotated syntax tree to an intermediate form, and converting the intermediate form to an executable form.

68 Claims, 14 Drawing Sheets

OTHER PUBLICATIONS

Min-You Wu and Daniel D. Gajski; "*Hypertool: A Programming Aid For Message-Passing Systems*;" Jul. 1990, pp. 330-343, vol. 1, No. 3, IEEE Transactions On Parallel and Distributed Systems.

Jing-Jang Hwang, Yuan-Chieh Chow, Frank D. Anger, and Chung-Yee Lee; "*Scheduling Precedence Graphs In Systems With Interprocessor Communication Times*;" Apr. 1989, pp. 244-257, vol. 18, No. 2, Siam Journal Computing.

Gilbert C. Sih and Edward A. Lee; "*A Compile-Time Scheduling Heuristic for Interconnection-Constrained Heterogeneous Processor Architectures*;" Feb. 1993, pp. 175-187; vol. 4, No. 2, IEEE Transactions On Parallel and Distributed Systems.

Tao Yang and Apostolos Gerasoulis; "*DSC: Scheduling Parallel Tasks on an Unbounded Number of Processors*;" pp. 1-36, IEEE Transactions On Parallel and Distributed Systems, 1994.

Charles J. Alpert and Andrew B. Kahng; "*Recent Directions in Netlist Partitioning: A Survey*;" pp. 1-93, UCLA Computer Science Department, 1995.

William J. Dally, J. A. Stuart Fiske, John S. Keen, Richard A. Lethin, Michael D. Noakes, Peter R. Nuth, Roy E. Davison and Gregory A. Fyler; "*The Message-Driven Processor: A Multicomputer Processing Node with Efficient Mechanisms*;" Apr. 1992; pp. 24-39, IEEE Micro.

F. W. Howell, R. Williams, and R. N. Ibbett; *Hierarchical Architecture Design and Stimulation Environment*; University of Edinburgh, 1994, pp. 363-366.

Quickturn Cobalt Webpage; "*Quickturn Boosts Speed, Flexibility In CoBalt 2.0*;" Apr. 20, 1998; pp. 1-4.

Vivek Sarkar; "*Partitioning and Scheduling Parallel Programs for Multiprocessors*;" Copyright 1989, pp. 1-201, The MIT Press.

C. Ajluni; "Advanced Emulation Tool Targets High-Speed Functional Verification"; vol. 45, No. 5, pp. 80, 82; Mar. 3, 1997; Electronic Design, Penton Publishing, USA.

European Search Report dated Apr. 21, 2004 (5 pgs.).

\* cited by examiner

METHOD AND APPARATUS FOR SIMULATION SYSTEM COMPILER

CROSS-REFERENCE TO RELATED APPLICATIONS

This application claims benefit of U.S. Provisional Application Ser. No. 60/313,762, filed Aug. 20, 2001, entitled "Phasers-Compiler Related Inventions," in the names of Liang T. Chen, Jeffrey Broughton, Derek Pappas, William Lam, Thomas M. McWilliams, Ihao Chen, Ankur Narang, Jeffrey Rubin, Earl T. Cohen, Michael Parkin, Ashley Saulsbury, and David R. Emberson.

This application claims benefit to Provisional Application Ser. No. 60/313,217, filed Aug. 17, 2001, entitled "Phaser System Architecture," and invented by Thomas M. McWilliams; Jeffrey B. Rubin; Derek Pappas; Kunle Olukotun; Jeffrey Broughton; David R. Emberson; William Lam; Liang T. Chen; Ihao Chen; Earl T. Cohen; and Michael Parkin.

BACKGROUND OF INVENTION

The invention relates to simulation of microprocessor performance. Modern high performance microprocessors have an ever-increasing number of circuit elements and an ever-rising clock frequency. Also, as the number of circuits that can be used in a CPU has increased, the number of parallel operations has risen. Examples of efforts to create more parallel operations include increased pipeline depth and an increase in the number of functional units in super-scalar and very-long-instruction-word architectures. As CPU performance continues to increase, the result has been a larger number of circuits switching at faster rates. Thus, from a design perspective, important considerations such as the time needed to complete a simulation and the time needed to debug a CPU must be taken into account.

As each new CPU design uses more circuit elements, each often operating at increased frequencies, the time required to simulate the design increases. Due to the increased time for simulation, the number of tests, and consequently the test coverage, decreases. In general, the result has been a dramatic increase in the logic errors that escape detection before the CPU is manufactured.

After a CPU prototype is initially manufactured and failure modes are uncovered, the time required to determine failure mechanisms is generally increasing due to the increased CPU complexity. Failure modes may be the result of logic errors or poor manufacturability of a circuit element. In both cases, circuit simulation helps to confirm or refute the existence of a logic error. If a logic error does not exist, the manufacturability of a circuit element may be the root cause. Even after a logic error failure mechanism is discovered and a solution is proposed, the time required to satisfactorily determine that the proposed solution fixes the logic error and does not generate any new logic errors has increased. Circuit simulation is key to the design and debugging of increasingly complex and faster CPUs.

CPU simulation may occur at a "switch-level." Switch-level simulations typically include active circuit elements (e.g., transistors) and passive circuit elements (e.g., resistors, capacitors, and inductors). A typical switch-level circuit simulator is "SPICE", which is an acronym for Simulation Program with Integrated Circuit Emphasis. SPICE typically models each element using an equation or lookup table. SPICE can model accurately the voltage and/or current of each circuit element across time.

CPU simulation also may occur at a "behavioral level." Behavioral level simulations typically use a hardware description language (HDL) that determines the functionality of a single circuit element or group of circuit elements. A typical behavioral level simulation language is "Verilog", which is an Institute of Electrical and Electronics Engineers standard. Verilog HDL uses a high-level programming language to describe the relationship between the input and output of one or more circuit elements. The Verilog HDL describes on what conditions the outputs should be modified and what effect the inputs have. Verilog HDL programs may also be used for logic simulation at the "register transfer level" (RTL).

Using the Verilog HDL, for example, digital systems are described as a set of modules. Each module has a port interface, which defines the inputs and outputs for the module. The interface describes how the given module connects to other modules. Modules can represent elements of hardware ranging from simple gates to complete systems. Each module can be described as an interconnection of sub-modules, as a list of terminal elements, or a mixture of both. Terminal elements within a module can be described behaviorally, using traditional procedural programming language constructs such as "if" statements and assignments, and/or structurally as Verilog primitives. Verilog primitives include, for example, truth tables, Boolean gates, logic equation, and pass transistors (switches).

HDL languages such as Verilog are designed for efficient representation of hardware designs. Verilog has support for handling signals of arbitrary widths, not only for defining and using an arbitrary width signal, but for treating any sub-field of such a signal as a signal in its own right.

Cycle-based logic simulation is applicable to synchronous digital systems and may be used to verify the functional correctness of a digital design. Cycle-based simulators use algorithms that eliminate unnecessary calculations to achieve improved performance in verifying system functionality. Typically, in a cycle-based logic simulator the entire system is evaluated once at the end of each clock cycle. Discrete component evaluations and re-evaluations are typically unnecessary upon the occurrence of every event.

HDL simulations may be event-driven or cycle-based. Event-driven simulations propagate a change in state from one set of circuit elements to another. Event-driven simulators may record relative timing information of the change in state so that timing and functional correctness may be verified. Cycle-based HDL simulations also simulate a change in state from one set of circuit elements to another. Cycle-based HDL simulations, however, evaluate the state of the system once at the end of each clock cycle. While specific intra-cycle timing information is not available, simulation speed is improved.

HDL simulations may be executed on reconfigurable hardware, such as a field programmable gate array (FPGA) chip. The FPGA allows dedicated hardware to be configured to match the HDL code. FPGA hardware provides a method to improve the simulation time. As the design changes, the time required to reconfigure the FPGA arrangement may prohibit many iterations. Also, the number of FPGA chips required for complex designs may be relatively large.

HDL simulations also may be executed on general purpose processors. General purpose processors, including parallel general purpose processors, are not designed specifically for HDL simulations. HDL simulations require a large number of operations of inputs and outputs that use bit-wise operations.

Large logic simulations are frequently executed on parallel or massively parallel computing systems. For example, parallel computing systems may be specifically designed parallel processing systems or a collection, or "farm," of connected general purpose processing systems. FIG. 1 shows a block diagram of a typical parallel computing system (100) used to simulate an HDL logic design. Multiple processor arrays (112, 113, 129) are available to simulate the HDL logic design. A host computer (116), with associated data store (117), controls a simulation of the logic design that executes on one or more of the processor arrays (112, 113, 129) through an interconnect switch (118). The processor arrays (112, 113, 129) may be a collection of processing elements or multiple general purpose processors. The interconnect switch (118) may be a specifically designed interconnect or a general purpose communication system, for example, an Ethernet network.

A general purpose computer (120) with a human interface (122), such as a GUI or a command line interface, together with the host computer (116) support common functions of a simulation environment. These functions typically include an interactive display, modification of the simulation state, setting of execution breakpoints based on simulation times and states, use of test vectors files and trace files, use of HDL modules that execute on the host computer and are called from the processor arrays, check pointing and restoration of running simulations, the generation of value change dump files compatible with waveform analysis tools, and single execution of a clock cycle.

SUMMARY OF INVENTION

In general, in one aspect, the invention relates to a method for compiling a cycle-based design. The method comprises generating a parsed cycle-based design from the cycle-based design, elaborating the parsed cycle-based design to an annotated syntax tree, translating the annotated syntax tree to an intermediate form, and converting the intermediate form to an executable form.

In general, in one aspect, the invention relates to a method for compiling a cycle-based design. The method comprises generating a parsed cycle-based design from the cycle-based design, elaborating the parsed cycle-based design to an annotated syntax tree, translating the annotated syntax tree to an intermediate form, converting the intermediate form to an executable form, representing the cycle-based design in an annotated symbol table, levelizing the annotated syntax tree, sorting the annotated syntax tree, detecting a procedure call outside the cycle-based design, and recording in a data structure required at run time to interpret the procedure call.

In general, in one aspect, the invention relates to a method for compiling a cycle-based design. The method comprises generating a parsed annotated syntax tree from the cycle-based design, inferring a logic type from parsed annotated syntax tree for each of a plurality of logic components, elaborating the plurality of logic components to construct a design logic comprising a hierarchical design tree and a flattened design connectivity, levelizing the design logic to schedule execution order of logical components using the flattened design connectivity, translating the parsed annotated syntax tree and levelized flattened design connectivity into an intermediate form operation, assigning each intermediate form operation to an execution processor, ordering of the intermediate form operation within the assigned execution processor, generating routing instructions for a message passing instruction to traverse a multiprocessor system, converting the intermediate form operation into an annotated symbol table, and converting the intermediate operation into executable form.

In general, in one aspect, the invention relates to a method for levelization of a cycle-based design. The method comprises collecting a plurality of simulated components by a logic type, identifying a design constraint violation in the cycle-based design, and sorting the plurality of simulated components according to the logic type into a component list. Sorting determines an execution order of the plurality of simulated components whereby each of the plurality of simulated components are evaluated only once per simulation clock cycle.

In general, in one aspect, the invention relates to a compiler. The compiler comprises a design analyzer configured to generate a parsed cycle-based design from a cycle-based design, a design elaborator configured to expand the parsed cycle-based design to an annotated syntax tree, a translator configured to translate the annotated syntax tree to an intermediate form, and a code generator configured to convert the intermediate form to an executable form.

In general, in one aspect, the invention relates to a computer system to compile a cycle-based design. The computer system comprises a processor, a memory, an input means, a display device, and software instructions. The software instructions are stored in the memory for enabling the computer system under control of the processor, to perform generating a parsed cycle-based design from the cycle-based design, elaborating the parsed cycle-based design to an annotated syntax tree, translating the annotated syntax tree to an intermediate form, and converting the intermediate form to an executable form.

In general, in one aspect, the invention relates to a computer system to compile a cycle-based design. The computer system comprises a processor, a memory, an input means, a display device, and software instructions. The software instructions are stored in the memory for enabling the computer system under control of the processor, to perform generating a parsed annotated syntax tree from the cycle-based design, inferring a logic type from parsed annotated syntax tree for each of a plurality of logic components, elaborating the plurality of logic components to construct a design logic comprising a hierarchical design tree and a flattened design connectivity, levelizing the design logic to schedule execution order of logical components using the flattened design connectivity, translating the parsed annotated syntax tree and levelized flattened design connectivity into an intermediate form operation, assigning each intermediate form operation to an execution processor, ordering of the intermediate form operation within the assigned execution processor, generating routing instructions for a message passing instruction to traverse a multiprocessor system, converting the intermediate form operation into an annotated symbol table, and converting the intermediate operation into executable form.

In general, in one aspect, the invention relates to a computer system for levelization of a cycle-based design. The computer system comprises a processor, a memory, an input means, a display device, and software instructions. The software instructions are stored in the memory for enabling the computer system under control of the processor, to perform collecting a plurality of simulated components by a logic type, identifying a design constraint violation in the cycle-based design, and sorting the plurality of simulated components according to the logic type into a component list. Sorting determines an execution order of the plurality of simulated components whereby each of the plurality of simulated components are evaluated only once per simulation clock cycle.

In general, in one aspect, the invention relates to an apparatus for compiling a cycle-based design. The apparatus comprises means for generating a parsed cycle-based design from the cycle-based design, means for elaborating the parsed cycle-based design to an annotated syntax tree, means for translating the annotated syntax tree to an intermediate form, and means for converting the intermediate form to an executable form.

In general, in one aspect, the invention relates to an apparatus for compiling a cycle-based design. The apparatus comprises means for generating a parsed annotated syntax tree from the cycle-based design, means for inferring a logic type from parsed annotated syntax tree for each of a plurality of logic components, means for elaborating the plurality of logic components to construct a design logic comprising a hierarchical design tree and a flattened design connectivity, means for levelizing the design logic to schedule execution order of logical components using the flattened design connectivity, means for translating the parsed annotated syntax tree and levelized flattened design connectivity into an intermediate form operation, means for assigning each intermediate form operation to an execution processor, means for ordering of the intermediate form operation within the assigned execution processor, means for generating routing instructions for a message passing instruction to traverse a multiprocessor system, means for converting the intermediate form operation into an annotated symbol table, and means for converting the intermediate operation into executable form.

In general, in one aspect, the invention relates to an apparatus for levelization of a cycle-based design. The apparatus comprises means for collecting a plurality of simulated components by a logic type, means for identifying a design constraint violation in the cycle-based design, and means for sorting the plurality of simulated components according to the logic type into a component list. Sorting determines an execution order of the plurality of simulated components whereby each of the plurality of simulated components are evaluated only once per simulation clock cycle.

Other aspects and advantages of the invention will be apparent from the following description and the appended claims.

DETAILED DESCRIPTION

Figure 1:
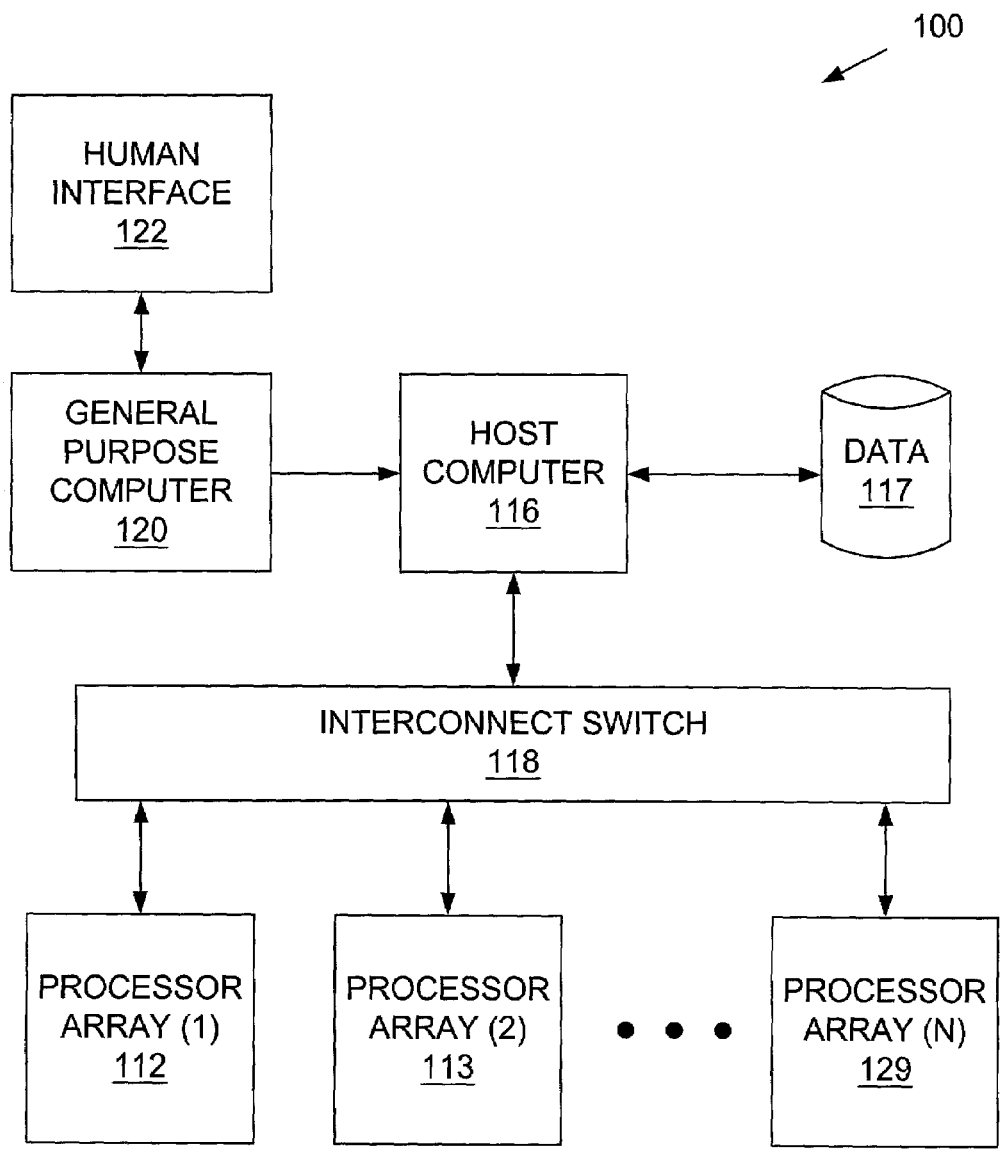
FIG. 1 shows a typical parallel computer system.

Specific embodiments of the invention will now be described in detail with reference to the accompanying figures. Like elements in the various figures are denoted by like reference numerals for consistency.

The present invention is a method and apparatus for compiling a cycle-based design in a simulation system. In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

A compiler provides a method and apparatus by which instructions to a computer are transformed from a human understandable representation to a computer understandable representation. An embodiment of the present compiler is configured to receive cycle-based design instructions. One embodiment receives HDL instructions in the Verilog language. Once the HDL instructions are received, the compiler is configured to transform the HDL instructions into a form, which can execute in a computing environment. In one embodiment, the computing environment is highly paralleled, which allows the environment to handle the code generated by the compiled HDL instructions efficiently.

Embodiment of Computer Execution and Simulation System Environment

Before describing in further detail cycle-based computation in a simulation system, a computer execution environment and a class of simulation systems (e.g., multiple instruction, multiple data (MIMD)) used with one or more embodiments of the invention is described below.

In an embodiment of the present invention, the computer execution environment may use execution processors to execute execution processor code on a general purpose computer, such as a SPARC™ workstation produced by Sun Microsystems, Inc., or specialized hardware for performing cycle-based computations, e.g. a Phaser system.

The system of the invention is a massively parallel, cycle-based computing system. The system uses an array of execution processors arranged to perform cycle-based computations. One example of cycle-based computation is simulation of a cycle-based design written in a computer readable language, such as HDL (e.g., Verilog, etc.), or a high-level language (e.g., Occam, Modula, C, etc.).

Figure 2:
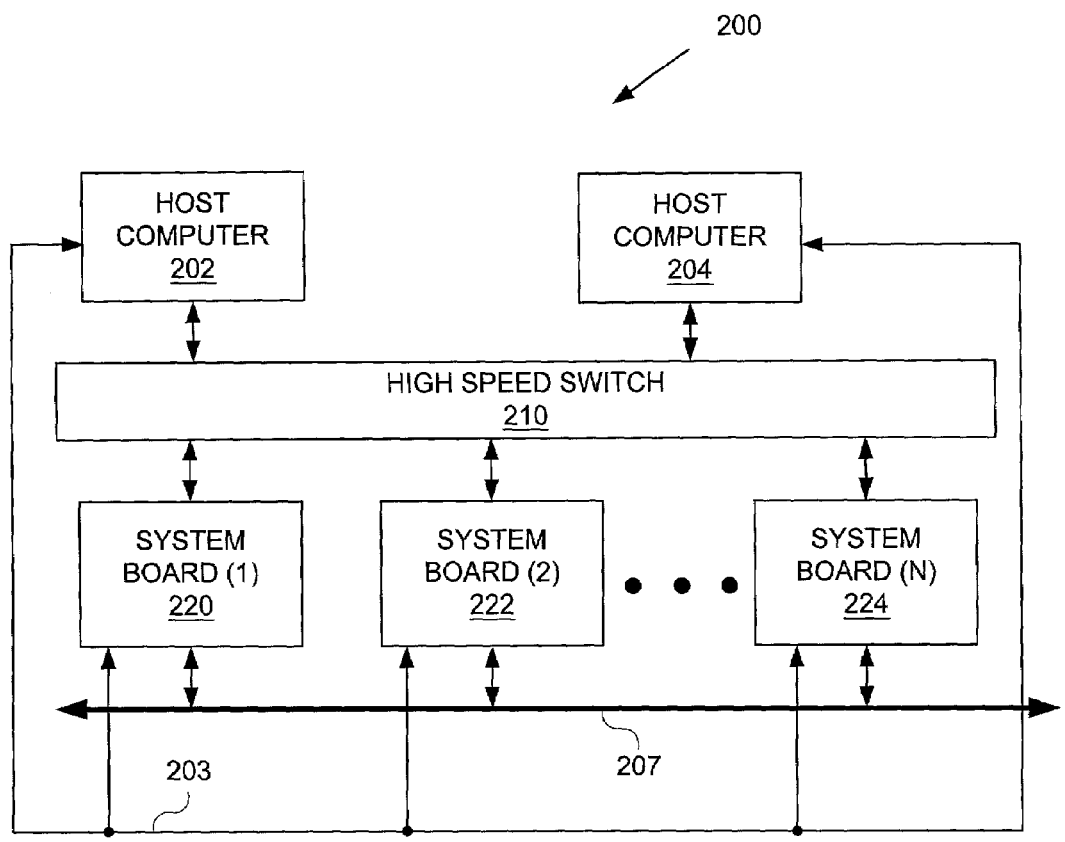
FIG. 2 shows a parallel computer system in accordance with an embodiment of the present invention.

FIG. 2 shows exemplary elements of a system (200), in accordance with one or more embodiments of the present invention. Cycle-based computation, such as a logic simulation on the system (200), involves one or more host computers (202, 204) managing the logic simulation(s) executing on one or more system boards (220, 222, 224). Each system board contains one or more Application Specific Integrated Circuits (ASIC). Each ASIC contains multiple execution processors. The host computers (202, 204) may communicate with the system boards (220, 222, 224) using one of several pathways. The host computers (202, 204) include interface hardware and software as needed to manage a logic simulation. A high speed switch (210) connects the host computers (202, 204) to the system boards (220, 222, 224). The high speed switch (210) is used for loading and retrieval of state information from the execution processors located on ASICs on each of the system boards (220, 222, 224). The connection between the host computers (202, 204) and system boards (220, 222, 224) also includes an Ethernet connection (203). The Ethernet connection (203) is used for service functions, such as loading a program and debugging. The system also includes a backplane (207). The backplane (207) allows the ASICs on one system board to communicate with the ASICs of another system board (220, 222, 224) without having to communicate with an embedded controller located on each system board. Additional system boards may be added to the system by connecting more system boards to the backplane (207).

Simulation of the cycle-based logic design in the cycle-based system occurs on a processor array in two modes: a run mode segment and a control mode segment. Run mode segment is the basic simulation running mode. In the run mode segment, there is no communication necessary between the host and simulation system besides basic runtime control and the execution of any user-provided C coded routines. In the control mode segment, the host sends commands to the simulation hardware and waits for responses. This mode is typically used in debugging and initialization of the simulation system.

A processor array may exist as specialized hardware, such as a massively parallel computer system designed for simulation using cycle-based computation, or as part of an appropriate computer system, such as a SPARC™ workstation produced by Sun Microsystems, Inc. Cycle-based logic design may also be simulated on a processor array, or a portion of the processor array. Thus, references herein to the processor array may refer to a portion of the processor array, or to multiple processor arrays.

Figure 3:
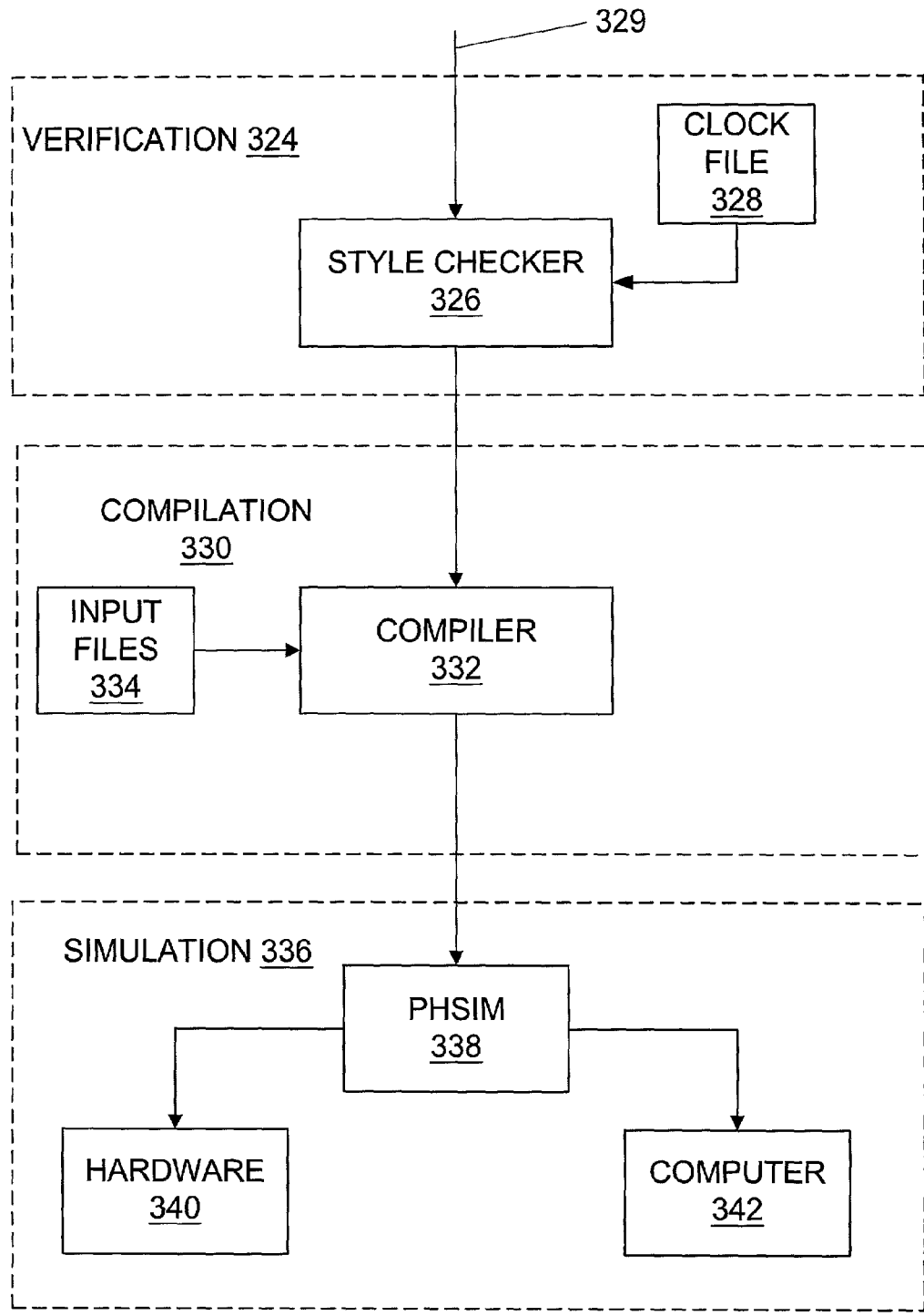
FIG. 3 shows a process of preparing a simulation of a cycle-based logic design to run on a cycle-based system in accordance with an embodiment of the present invention.

In accordance with one or more embodiments of the present invention, FIG. 3 shows a process of preparing a simulation of a cycle-based logic design to run on a Cycle-based system. The process includes three separate phases. The first phase is a verification phase (324). This phase includes a style checker (326), which parses and checks high level design code of a program (329) representing the cycle-based design. The program is checked for adherence to a cycle-based design standard, e.g., synchronous logic design, no combinatorial logic loops, etc. An error action during this phase results from nonconformance to the defined cycle-based design standards. A clock file input (328) defines clocks cycles for the simulation. The output of the verification phase (324) produces a verified cycle-based design.

The second phase is a compilation phase (330), which receives the verified cycle-based design as input from the verification phase (324). The compilation phase (330) uses a translation component, such as a compiler (332), to compile the verified cycle-based design of the verification phase (324). The compiler (332) decomposes the verified cycle-based design into execution processor code that may be executed in parallel on a processor array of the Cycle-based system by one or more execution processors. The compiler also produces routing tables and other information, such as routing processor code, interface code and an annotated symbol table. Routing tables enable static routing of messages sent during run mode segment. An annotation symbol table involves recording physical locations where the values of nets and registers have been stored, so that user interface and Programming Language Interface (PLI) routines may access values of nets and registers during runtime. Input files (334), e.g., PLI and TVI files, etc., provide functionality for items such as system task calls and trace vectors. A user system task call enables a host computer to execute an appropriate portion of a simulation, A trace vector typically contains test input data and expected outputs for testing. Errors in cycle-based designs input into the compiler (332) causes an error action. The compiler and code generation includes a scheme for routing of messages and placement of compiled execution processor code so that there is some optimization in the choice of which of the parallel execution processors of the simulation hardware to use for certain tasks. This is because the time required for delivery of a message from one processor to another depends upon the data connection component between those execution processors, (i.e., the number of hops the message takes in traversing the data connection component from source processor to destination processor). One skilled in the art can appreciate that compilation of a program may be targeted to a specific execution environment and/or platform, e.g., Phaser system hardware or an appropriate computer, such as a SPARC™ workstation produced by Sun Microsystems, Inc.

The third phase is the simulation phase (336), which receives input in the form of execution processor code from the compilation phase (330). A PHaser SIMulator (338) (PHSIM) typically runs on a host computer and controls and monitors execution of simulations executing on the Cycle-based system. The host computer includes such hardware and software mechanisms as are needed to manage simulation, e.g., loading execution processor code onto a processor array. PHSIM (338) enables user interaction with a simulation using a graphical user interface (GUI) or with a command line interface, interactive modification of simulation state, breakpointing, test vector use, system task functionality, signal tracing, single-stepping on clock cycles, and other functionalities. A simulation cycle begins with one or more simultaneous clock edges and completes when every dependent event has completed evaluation. The simulation phase (336) may run on system hardware (340), which is designed for cycle-based computation, or on an appropriate computer, such as a SPARC™ workstation (342) produced by Sun Microsystems, Inc.

The computer systems described above are for purposes of example only. An embodiment of the invention may be implemented in any type of computer system or programming or processing environment.

Compiler

Figure 4:
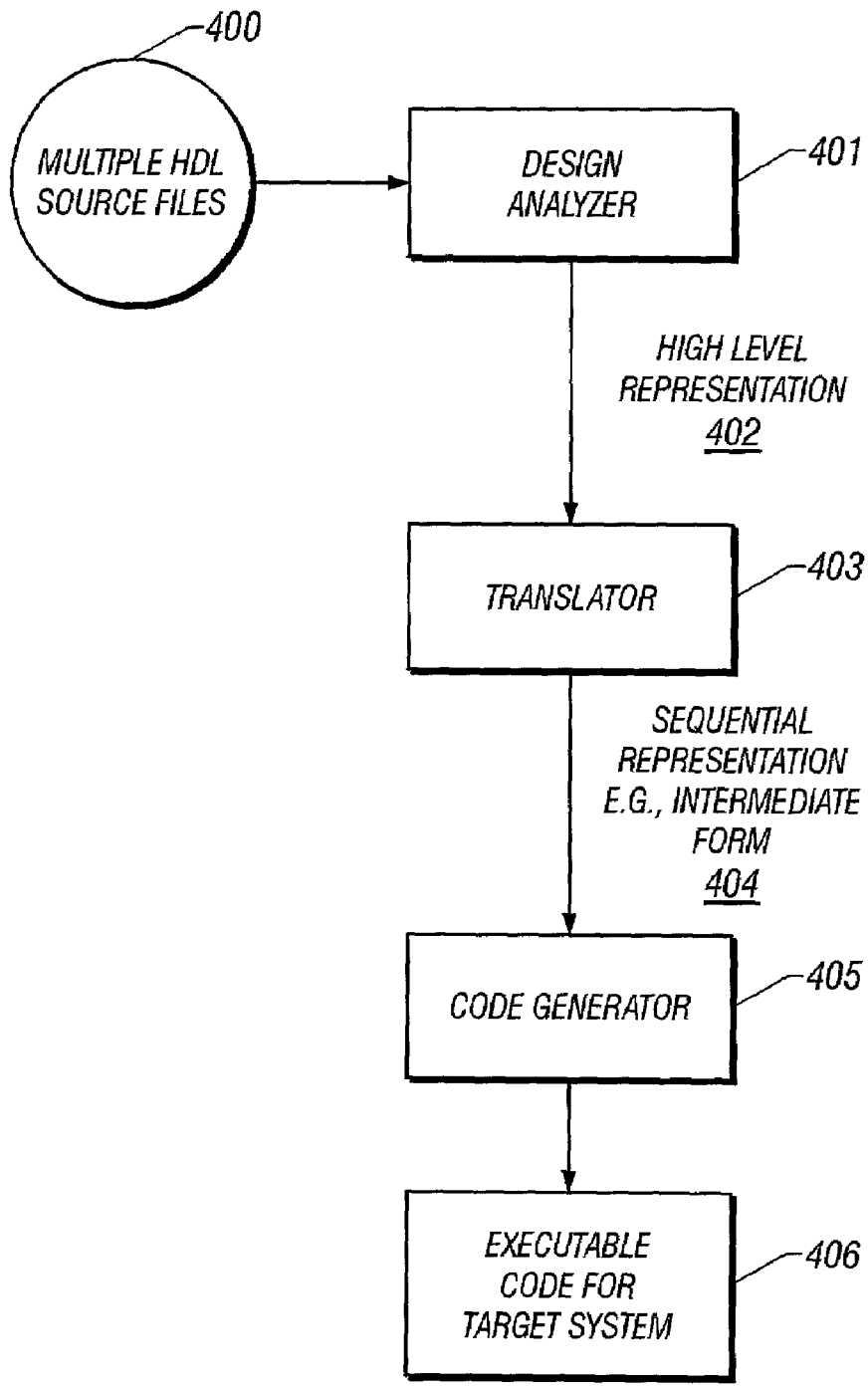
FIG. 4 is a flow diagram of a simulation compiler in accordance with an embodiment of the invention.

As illustrated in FIG. 4, in one or more embodiments of the invention, the simulation compiler includes a design analyzer (401), a translator (403), and a code generator (405). The design analyzer 401 receives input in the form of HDL source files (400) (e.g., Verilog modules) and generates a high-level representation (402) of the simulation design, ordered for single-pass execution in a cycle-based system. This high-level representation (402) may include, for example, a component reference data structure (i.e., an object-oriented data structure) containing shared information for component types; a component instance data structure containing information for specific component instances as well as flattened connectivity information, components (instances) collected by type, a list of simulation variables; and a sorted component list, in which the sort order corresponds to the execution order for single-pass, cycle-based execution. The translator (403) receives the high level representation (402) and translates the operations into a sequential representation (or intermediate form) (404) that describes the simulation operations. The sequential representation (404) is transformed by code generation process (405) into executable code (406) for a target simulation system.

It will be apparent to one skilled in the art that the techniques described in association with the design analyzer (401) render an elaborated logic design suitable for use with all classes of computer-aided logic design tools (e.g., the cycle-based simulation system described herein, a power-analysis tool, or a fault-grading tool).

Furthermore, the translator (403) may direct execution of the program through a variety of mechanisms, including production of a sequential representation (404) described herein, production of a program in a language such as C, production of assembly language or binary instructions for the target simulation system, or by direct interpretation of the prescribed operations.

The design analyzer (401), translator (403), and code generator (405), mechanisms may be used with any target simulation system. For example, the sequential representation (404) may be transformed into a sequential program for execution on a general purpose or application specific computer, or may be partitioned into a plurality of threads for execution on an MIMD simulation system.

Design Analyzer

Figure 5:
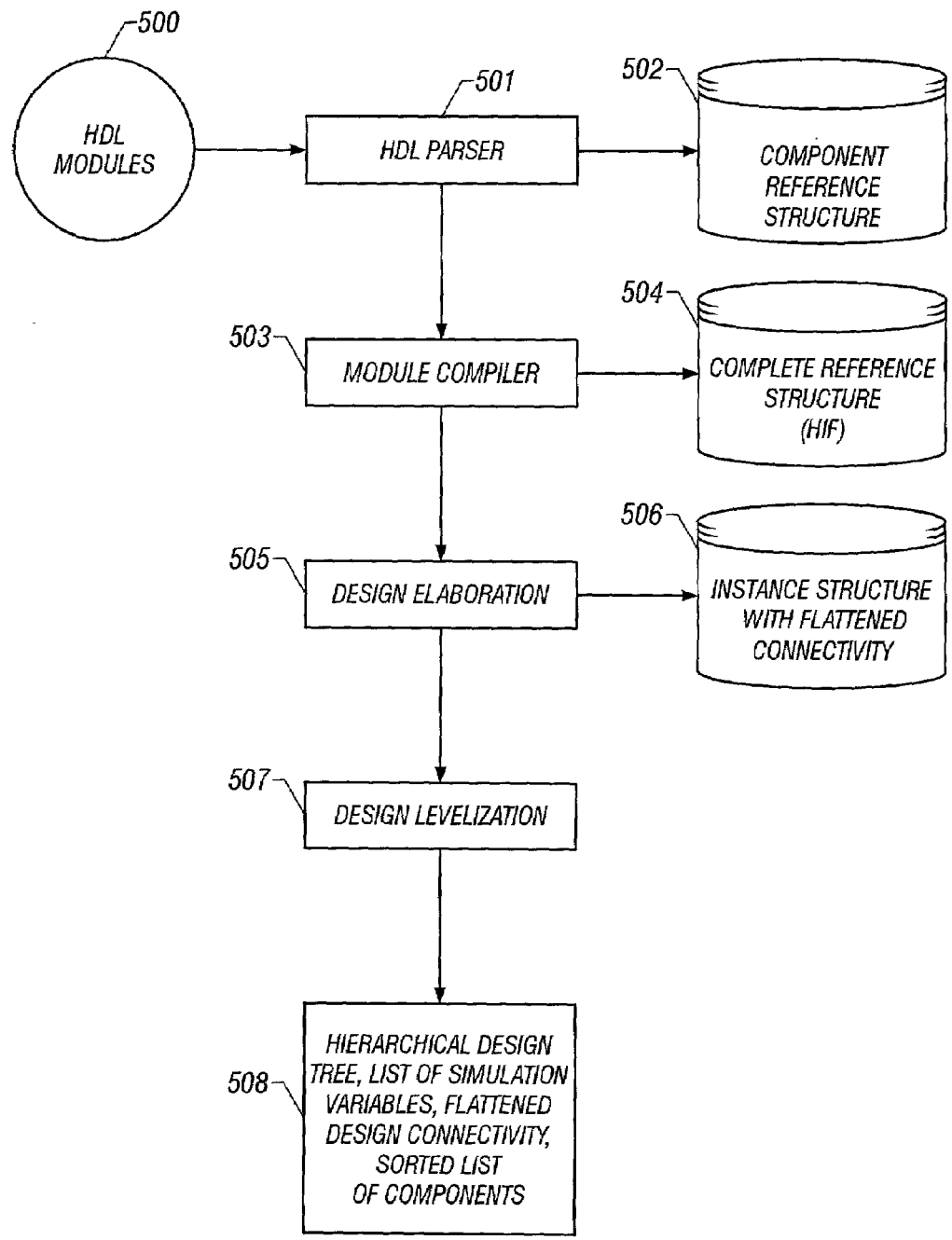
FIG. 5 is a flow diagram of design analysis in accordance with an embodiment of the invention.

The flow of an embodiment of the design analyzer (401) is illustrated in the flow diagram of FIG. 5. One or more HDL modules (500) are provided to HDL parser (501). The modules are then parsed to generate the component reference data structure (502). Component reference data structure (502) contains, for example, one component object definition for each module submitted. Those component object definitions provide the basis for component instantiation in later stages. The module compiler (503) expands the object definitions from reference data structure (502) and extracts the logic modeling and pin information for each component. A logic inference function is applied to each component to determine the logic content. A complete reference data structure (504) in a high-level abstract representation, referred to herein as Hierarchical Intermediate Form (HIF) or Verilog Intermediate Form (VIF), is generated after the module compilation.

In the design elaboration phase (505), the compiled design modules are linked together into a hierarchical design tree, from which instances of component objects are recursively generated. Binding is performed and simulation variables are created for local nets. The output of the design elaboration phase is an elaborated instance data structure (506) with flattened connectivity information. Design levelization phase (507) operates upon instance data structure (506) to collect all components by logic type and formulates a hierarchical design tree, a sorted list of components in execution order, a list of simulation variables, and a flattened design connectivity (508). The following description discusses the above compilation stops in greater detail.

Module Compilation

The module compiler (503) operates upon the initial design reference data structure (502) to build a more complete logic model for each module, now expressed as a component object type. The module compilation process, in accordance with one or more embodiments of the invention, is illustrated in the flow diagram of FIG. 6.

The module compilation process begins in Step 600 with design expansion. Design expansion includes three operations: function/task inlining (Step 600A), complex expression translation (Step 600B), and loop unrolling (Step 600C). Function inlining (Step 600A) involves replacing function calls within each module with the actual code statements of the function. The function is thus evaluated explicitly "inline" with the rest of the module, removing any branching entailed by the original function call. Take, for example, the following function written in pseudo-code:

```
function increment (i)
begin
    return i+1;
end.
```

Inlining would then transform the statement:

```
into:     assign x = increment (y).
          assign x = y+1;
```

Complex expression expansion (Step 600B) addresses the issue of complex expressions within module instantiations. For example, given a module "decrement( )" defined as:

```
decrement (x,y)
    assign x = y-1
end
``` and a module instantiation as follows:

```
decrement (d, a & b & c)
``` an example of expression expansion is to replace the module instantiation with the following code:

```
assign temp = a & b & c;
decrement (d, temp);
```

This expansion facilitates later binding/aliasing optimizations during the elaboration phase. When binding is performed based upon module port information, bound variables may share common storage. For example, when two wire references are bound together, the wires may be implemented with separate aliases to a common simulation variable. However, complex expressions complicate the binding issue, as pins cannot be bound to, and share storage with, complex expressions. Thus, the use of a temporary component simplifies binding operations and facilitates storage sharing. In the above example, without expansion, pin y would be bound to the complex expression (a & b & c). After expression expansion, however, pin y would be bound to the temporary variable "temp" rather than the complex expression, permitting aliasing optimizations.

In Step 600C, all loop structures within a module are unrolled for inline evaluation. For example, given a set of statements, A, B, C coded to execute within a loop for m iterations, the loop would be replaced with m inline sets of statements A, B, C. This step removes any backward branching due to loop structures.

A component models a hardware device in HDL. A component is also a basic concurrent execution unit in simulation. In Verilog, a component is defined to be a gate, a primitive, a continuous assign statement, or a process. A component pin is defined as a terminal point of the component that connects to the external environment. If the component is a primitive, the component pins are the primitive pins. If the component is a continuous assign statement, the component pins are the Verilog variables or part selected variables of the statement left hand side (LHS) and right hand side (RHS) expressions. If the component is a process, the component pins are the Verilog variables or part selected variables of each statement in the process, except the variables that are used only internally to the process.

Figure 6:
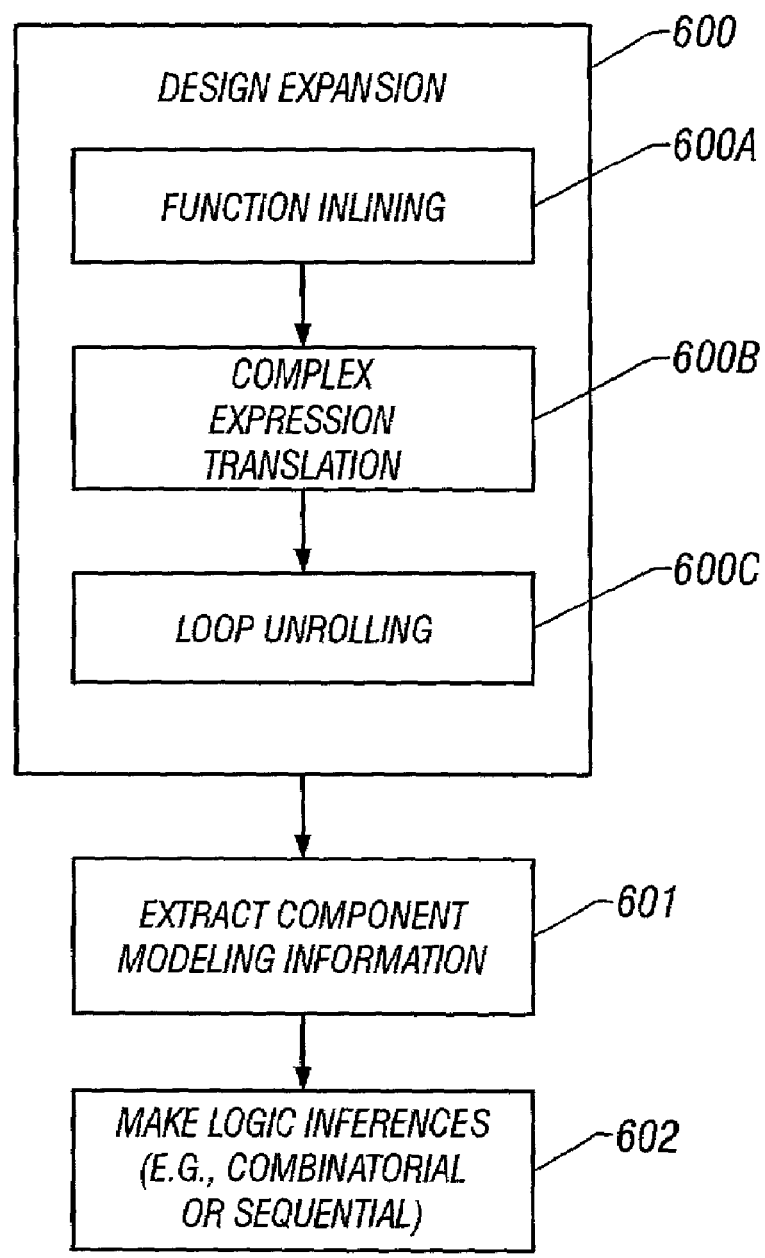
FIG. 6 is a flow diagram of a module compiler process in accordance with an embodiment of the invention.

Still referring to FIG. 6 and following design expansion (600), the component modeling information is extracted from the component in Step 601. This extraction step includes, for example, the extraction of pin information from the component. Pin information may be gathered from the arguments or expressions of the component. For example, x and y may be variables in an expression of a continuous assign statement (e.g., assign x=y). The type of pin (e.g., in, out, inout, etc.) may be determined from the internal code of the component.

In Step 602, the software analyzes the statement content of the component to infer the logic content of the component. The object is to classify a component as a sequential logic component or a combinatorial logic component. A sequential logic component is defined as a component that can store logic states across cycle boundaries. If not, the component is a combinatorial logic component.

In Step 602, logic inferences are drawn from component statements to determine whether a component may be classified as a sequential logic component or a combinatorial logic component. If a component is classified as a sequential logic component, the clock pin, data input pin (D) and data output pin (Q) are identified. If the component is a combinatorial component, the input/output pin dependencies are determined. Once the sequential/combinatorial logic classification is performed on a component reference, the classification for any component instances referencing that component is also known. Similarly, other information obtained during the steps of module compilation is applicable to all instances of the modules in the simulation design. The reference data structure contains module information in a high-level hierarchical intermediate form (HIF), such as a collection of a reference simulation component objects.

Abstract Class Descriptions

A number of abstract object class definitions are provided in one embodiment of the invention. These include vSobj Class, vComponent Class, and vExpr Class. vSobj Class objects represent possible candidates for a simulation object in the simulation engine. A simulation object is a simulation variable that is used to store logic state in the simulation engine. This could represent a simulation net or a state variable in the compiled design. Multiple design instance names can point to the same simulation variable.

vComponent Class describes an independent concurrent simulation unit. A simulation unit is a group of simulation statements that are logically executed in sequential order atomically. After code generation, multiple concurrent components are converted to instructions that may be executed in parallel. vExpr Class represents expressions.

A module contains a vector of vComponent and a vector of vSobj. Sub-classes of vComponent for design include: continuous assign statement, gate primitive, process (always/initial block), and module instantiation. Sub-classes of vSobj include: Net (wire), reg, memory, named event, integer, real number, integer time, and real time.

Design Elaboration

Referring back to FIG. 5, in the design elaboration phase (505) of the compiler, HIF input containing one or more modules of reference data is read into the elaborator process. The reference data contains the data structure objects generated by the module compiler. As the modules are generated in a hierarchical manner, with parent modules instantiating child modules within, the data objects also embody the hierarchical module structure of the simulation design. A goal of the elaboration phase is to process the hierarchical reference data structure and generate a complete instance data structure of component objects representing the simulation design (e.g., an annotated syntax tree).

Figure 7:
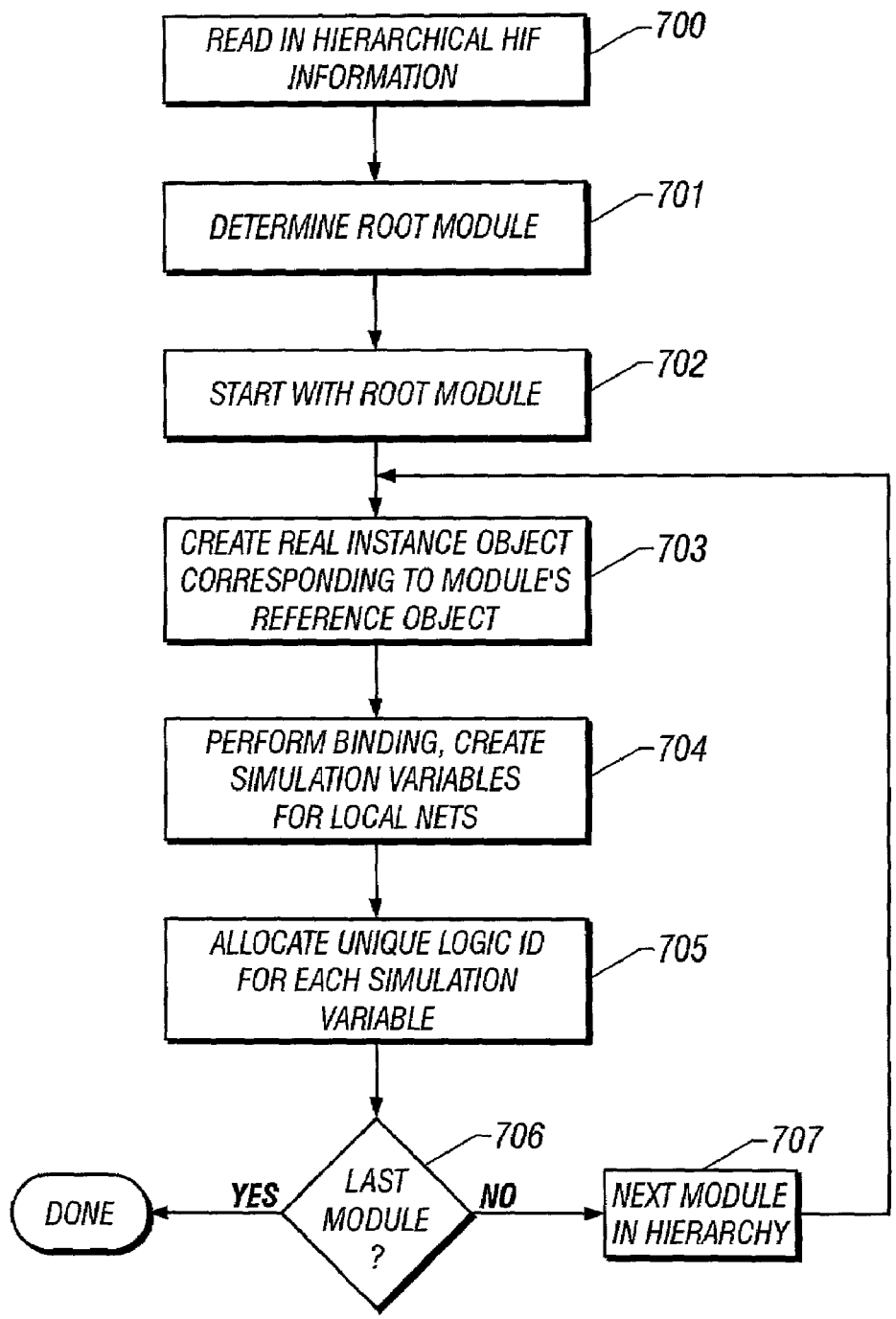
FIG. 7 is a flow diagram of a design elaboration process in accordance with an embodiment of the invention.

FIG. 7 is a flow diagram of one embodiment of a design elaboration process in accordance with the invention. In Step 700, the HIF information (which is an output form of module compilation) is read as input, and, for example, hashed in a global vector. The top, or "root" module is determined at Step 701. This is accomplished by examining each module and marking the child modules. An unmarked module is a root module candidate, as it is not referenced by any other module. In most cases, there is only one root module candidate. However, the simulation system permits multiple root module candidates. If there are multiple root module candidates, the hierarchical depth of each root module is determined (i.e., how many levels of child modules are associated with the module) and the candidate with the greatest depth is considered the root module. Root module candidates that are not selected as the final root module may be ignored by the translation process. In the case of multiple root design, multiple design trees are created internally and co-exist.

At Steps 702–707, a hierarchical design tree is built. The hierarchical design tree starts from the root module (702) to create the module instance (703), and loops through all the module instantiation components in the current module, to create the child module instances recursively. Through the module port interface, if both the higher level connection and lower level connection are nets, these two nets are associated with the same simulation variable object. Therefore, in this embodiment, all the net instances that are electrically wired together are assigned to the same simulation variable object. Other types of port connections, such as net connecting to reg, or integer connecting to net, have simulation variable objects.

In one embodiment, the root module is set as the current module (Step 702). A design instance of the current module is created (Step 703). Every instance object has a pointer to its corresponding reference object in the HIF reference data structure, which contains the shared data, such as the name string and reference attributes. There is a vector of Sobj references in the module reference. The instantiated module creates a corresponding vector of Sobj instances. The Sobj instances are created in the same order as the Sobj references, so the module instances can share the same Sobj hashing table from the module reference. There is also a vector of component references in the module reference. The instantiated module also creates a corresponding vector of component instances. The component instances are created in the same order as the component references, so the component hashing table in the module reference is shared too.

Binding is performed to create simulation variables for local nets of the current object (Step 704). A local net of a module is defined as a net that is not connected to any input port or output port of the module. However, a local net may be connected to the port of lower level modules. In other words, a local net is the net instance in the highest hierarchical level to represent an independent electrical wire. When the design elaborator encounters a local net, the design elaborator creates a simulation variable object to associate with the local net. This simulation variable is shared by the lower level net instances, which are electrically wired to the local net.

In an embodiment of the invention, the local net may be a net vector containing multiple bits. In this case, a simulation variable object is created that includes the entire local net vector. A simulation variable object represents a single simulation entity in the compiled code image. The implication of the local not approach is that the bit grouping in RTL data representation is determined by the local net declaration. In a conventional hierarchical design, a bundle of nets is declared as a single vector in higher level module and is decomposed into bit nets or sub vector nets in lower level modules. Because a local net is the net instance in the highest hierarchical level, one embodiment of the invention lets local net declaration determine the grouping of individual bit nets. For other kinds of Sobj instances, such as reg instance or variable instance, the invention creates a new simulation variable object to associate with the Sobj instance.

In design elaboration, the ports of the current module are bound to the parent module. This is an upward binding process. Upward binding is advantageous because the elaborator has all the data needed to do upward binding. The elaborator may not have the lower module data ready to perform downward binding.

A lower level net can be aliased to the upper level net or to a sub-range of the upper level net. In other words, any net instance corresponds to a single simulation variable object or a sub-range of a single simulation variable object. To minimize the complexity of the data representation, single net instance (either scalar or vector) may be disallowed from corresponding to multiple simulation variable objects.

According to one embodiment of the invention, an input port is a net object. If the upper level connection is also a net object, these two nets are aliased together by sharing the same simulation variable object. If the upper level connection is a single part selected net expression, the lower level net is aliased to a sub-range of the upper level net. In other words, the lower level port net is associated with a sub-range of the simulation variable, which is created in the upper level module. If the upper level connection is another kind of expression, the process of complex expression translation described in FIG. 6 at Step 600B would have previously introduced a new temporary simulation variable to associate with the lower level port net.

The upper level connection to an output port should be a net type expression and the output port can be a net or a reg object. According to one embodiment of the invention, if the output port is a net and the upper level connection is a single net or a single partially selected net expression, they may be aliased together and share the same simulation variable object. If the output port is a net and the upper level connection is another kind of expression, the process of complex expression translation described in FIG. 6 at Step 600B would have previously introduced a new temporary simulation variable to associate with the output port net. If the output port is a reg, a continuous assignment component may be created to model the port connection.

An inout port should a net object and the upper level connection to the inout port should be a net type expression. According to one embodiment of the invention, as a proposed aliasing rule, only when the port is a net object and the upper level connection is a single net or a single part selected net expression, the aliasing is allowed. Because a unidirectional continuous assignment cannot model the bi-directional inout connection, the design elaborator may be designed to flag an error when the design elaborator encounters other types of connections to the inout port. One skilled in the art will note, however, that the author of the HDL program can work around this restriction by changing the upper level connection expression of the inout port.

Referring to FIG. 7, if the current module is the last module (Step 706), elaboration is complete. If the current module is not the last module (Step 706), the next module in the hierarchy (e.g., a child of the current module) is selected as the new current module (Step 707). From Step 707, the elaborator process returns to Step 703.

Signals that have multiple driving sources are resolved at design elaboration described as Step 505 of FIG. 5. A conflicting signal state can occur at net type simulation variables. There should not be any conflicting signal state in reg or integer variables. The elaborator may loop through each simulation net variable to determine if there are conflicting signal states. If there is more than one driving source to the net, a phantom gate component is created and inserted to resolve the possible conflicting signal state. Optionally, if all the driving gates of a phantom gate are tri-state components with different selecting states, the entire group of gates can be optimized and replaced with a multiplexor gate.

Phantom Gate Insertion

Figure 8:
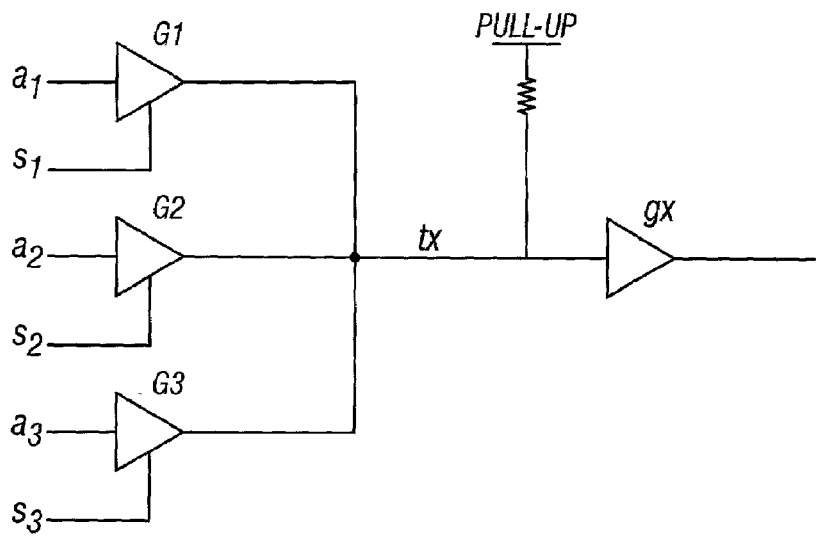
FIGS. 8 and 9 illustrate the insertion of a "phantom gate" in accordance with one embodiment of the present invention.
Figure 9:
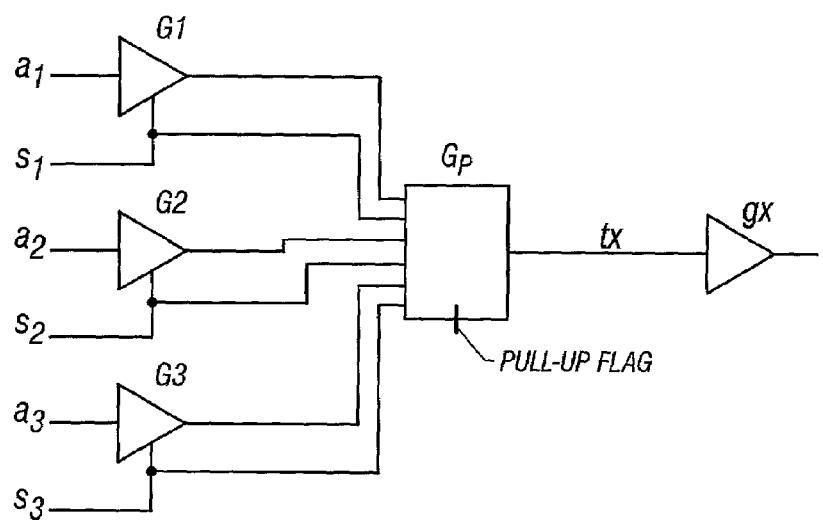

Phantom gate insertion is described in connection with FIGS. 8 and 9. A tri-state net with multiple driving sources is shown in FIG. 8. This tri-state net has a weak pull-up driving source. Design analysis inserts a phantom gate to the tri-state net as shown in FIG. 9. All the output pins and select pins of the tri-state driving gates are connected to input pins of the phantom gate. The pull-up flag of the phantom gate is turned on. The output pin of the phantom gate is connected to the receivers of the tri-state net.

If the driving gate has no select pin, the corresponding select input pin of the phantom gate is bound to the constant value one (1), meaning the driving gate is always on. The logic operation of the phantom gate may be described as follows:

1. If none of the drivers is on, the output of the phantom gate is decided by the state flag: keep state: previous state; pull-up: 1; pull-down: 0; none: high Z state.
2. If only one of the drivers is on, the output state of that driver is the phantom gate output state.
3. If more than one driver is on with the same logic state, the common state is the phantom gate output state.
4. If more than one driver is on with the different logic states, the phantom gate output state is unknown and a simulation error message may be output.

Design Levelization

Design levelization is performed in one or more embodiments of the invention to facilitate the generation of cycle-based simulation code that can evaluate all simulated elements exactly once to arrive at a steady state, for a given simulation clock cycle, with a single pass of the generated code. To this end, the instance data structure (506) generated by the design elaborator is analyzed, to collect components (i.e., instances) by type (e.g., clock logic, sequential logic, data logic, initial logic, etc.), as well as to identify any possible conflict issues, such as combinatorial logic loops. After the levelization analysis is performed, the logic components are sorted according to type to determine an execution order that results in a single pass solution (i.e., one-time evaluation of each component per simulation clock cycle).

Figure 10:
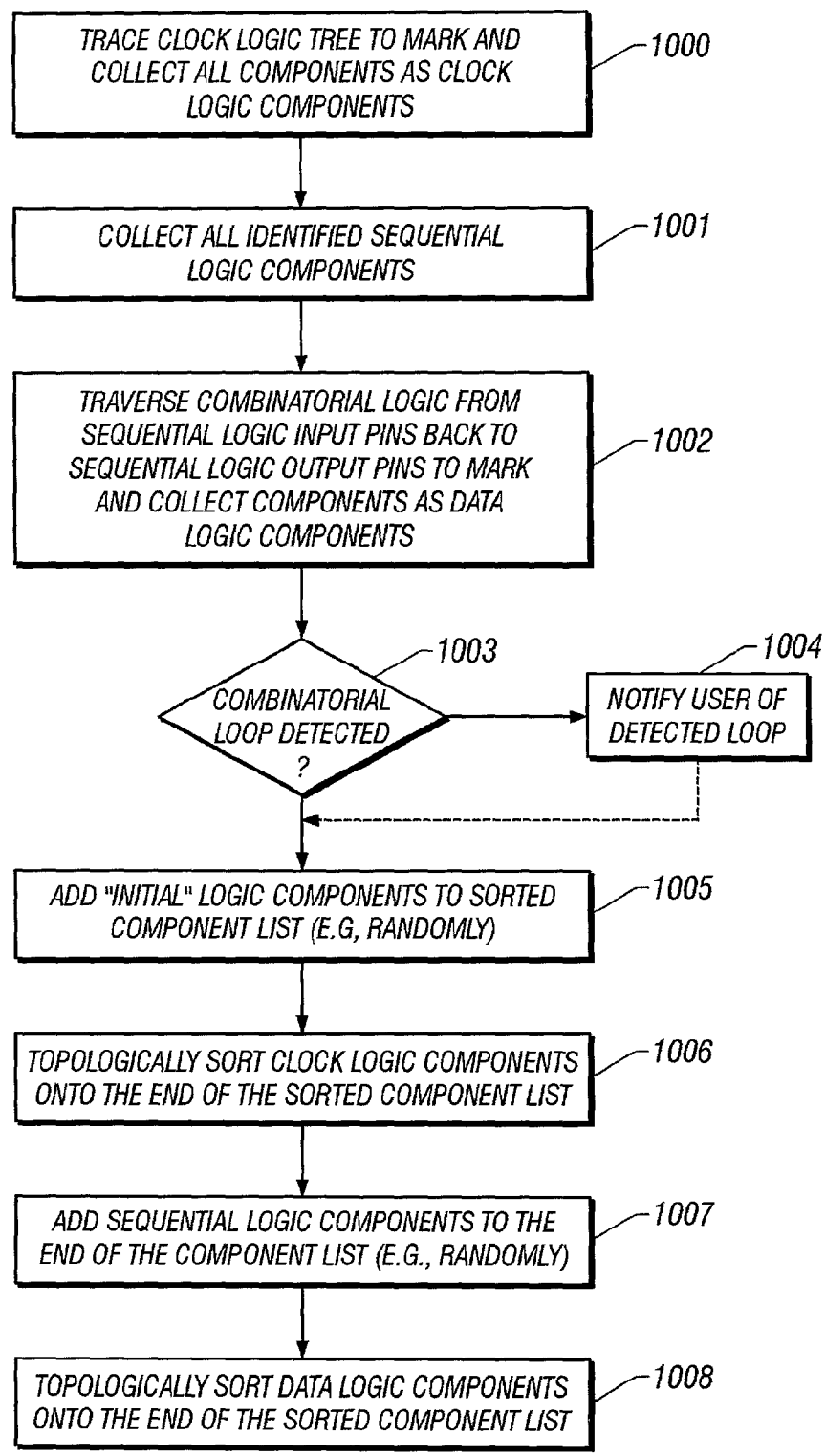
FIG. 10 is a flow diagram of a levelization process in accordance with an embodiment of the invention.

FIG. 10 is a flow diagram of one embodiment of a levelization process. In Step 1000, all "clock logic" components are identified and collected. Clock logic refers to those combinatorial components that are evaluated prior to a clock signal reaching the clock pin of a sequential logic device. The identification of clock logic components may be accomplished, for instance, by performing a trace of the clock logic tree. For example, given a user defined clock source signal, a tracing routine may trace through all logic nets and combinatorial logic components until each branch in the clock tree reaches a terminus at a known clock pin of a sequential logic component. Each combinatorial logic component passed in the trace is marked and collected as a clock logic component. If a data input pin of a sequential logic component is encountered instead of a clock pin, a warning message may be printed that indicates a possible design error.

In Step 1001, all sequential logic components are collected. The sequential components are known, for example, because they were inferred from the prior "logic inference" performed as Step 602 in FIG. 6. Those combinatorial logic components that reside in data nets between sequential logic output and input pins or between the external input/outputs of the circuit and the sequential elements are marked and collected as "data logic" components (Step 1002). The identification of data logic components may be accomplished, for example, by traversing backwards from an input pin of a sequential logic component, through all intervening combinatorial logic components, until the output pin of another sequential logic component is reached. All combinatorial logic components traversed in this manner are marked and collected as data logic components.

Figure 11:
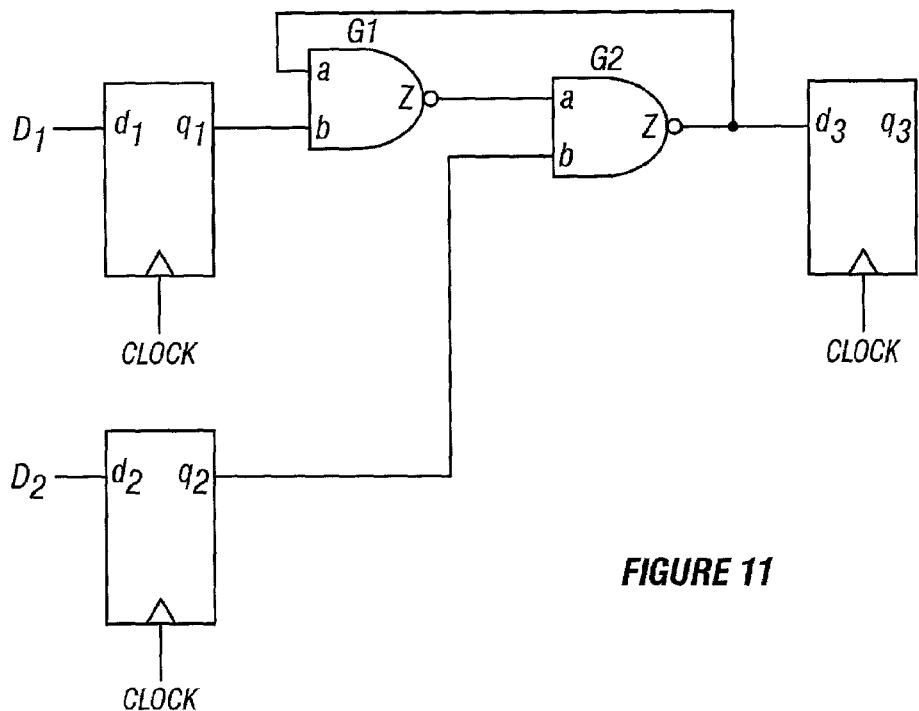
FIG. 11 illustrates a combinatorial logic loop.

In one or more embodiments, during the traversal Step 1002, the levelization process detects any combinatorial logic loops. A combinatorial logic loop is defined as a logic data path from a design node coming back to the same node through some combinatorial logic components without going through a sequential element. An example of a combinatorial logic loop is shown in FIG. 11. The logic data path from pin a of component G1 through pin z of G1 and pin z of G2 coming back to the original point is a combinatorial logic loop. Such loops can prevent complete evaluation of the simulated circuit in a single pass. For example, the logical value at the input of a previously evaluated component may be altered by a logic loop, requiring re-evaluation of the component until a steady state is reached within the loop. Because reevaluation is contrary to the desired goal of a single pass solution, a determination is made when a combinatorial logic loop is detected (Step 1003), and the user is notified in some manner (e.g., an error or warning is indicated in an alert window or logged to a file) in the instance of a loop detection event (Step 1004). In one or more embodiments, a loop detection event ends or stalls the compilation process, so that the user may correct the HDL program before continuing.

Once all components have been collected in separate groups, (e.g., clock logic, sequential logic, and data logic), the components are sorted into a component list, the order of which specifies the execution order for evaluation of those components. The group order (e.g., clock logic components before sequential logic components) ensures that the inputs for a given type of component have been evaluated prior to evaluation of that given component. For example, evaluation of sequential logic components is safe once all clock logic components have been evaluated, and evaluation of all data logic components is safe once all sequential logic components have been evaluated. An embodiment of this sorting process is described in Steps 1005–1008.

In Step 1005, any "initial" logic components are added to the sorted component list in an arbitrary order i.e., order within the subgroup does not matter. "Initial" logic components are components associated with "initial" Verilog statements, or other similar HDL constructs, that are executed once at the beginning of a simulation (e.g., to initialize specific simulation variables). These logic components are placed first in the sorted component list. The relative ordering of the initial logic components may be randomly determined, for example.

In Step 1006, all clock logic components are added to the end of the sorted component list. The order in which the respective clock logic components are placed into the list may be determined topologically. For example, during traversal of the clock tree, each node between components may be labeled with a level number, the source clock signal representing level 0. The output of each clock logic component is given a label that is one greater than the maximum of the levels assigned to its input pins. The clock logic components can then be sorted in dependency order according to the levels assigned to their output pins, upward from one. Components with the same level numbers can be placed in an arbitrary order. All sequential logic components (e.g., flip-flops) are added to the end of the sorted component in an arbitrary order (Stop 1007).

In Step 1008, all data logic components are added to the end of the sorted component list. As with the clock logic components, the data logic components are ordered in topological fashion. A similar mechanism (i.e., assigning levels during traversal from an origin, for instance a sequential logic component output pin), may be used to sort the data logic components in a manner that accounts for data dependencies.

The output of the design levelization phase is a sorted list of components in execution order, as well as a list of simulation variables. The steps of sorting the collected components may be considered part of a translation phase (403) as described in FIG. 4, with prior component collection steps considered a logic network analysis portion of the design analysis phase (401). The translation phase is further described below.

Translation

Figure 12:
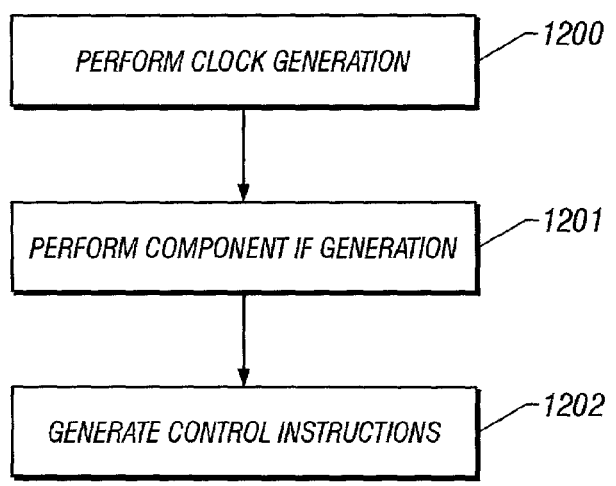
FIG. 12 is a flow diagram of a translator in accordance with an embodiment of the invention.

FIG. 12 is a flow diagram of a translation process in accordance with an embodiment of the invention. The translator receives the elaborated, levelized, and sorted object-oriented design data structure produced by the design analyzer and converts it to a sequential representation (e.g., intermediate form instructions) describing the simulation operations for input to the code generator. In Step 1200, intermediate form instructions are generated to simulate the global simulation clock and update the value of those simulation variables designated as clock source signals. Instructions are generated to evaluate each of the design components in the sorted order established by the design analyzer (Step 1201). The instructions generated in the previous steps are enclosed in a control loop that repeatedly executes successive simulation cycles until the program is halted by execution of an appropriate Verilog construct (Step 1202).

Evaluation Order and the Simulation Cycle

In cycle-based code, each component can be classified as either a clocked sequential process, or as a combinatorial process. Clocks are either defined by an external clock definition file, or by stylized constructs (e.g., "always #N clk=~clk").

Execution of a sequential component is conditional upon the rising or falling edge of a clock signal. Sequential devices may also be conditional upon reset signals, for example, which are treated like clocks. A combinatorial component is a strict function of its inputs, and contains no state variables. Execution of a combinatorial process may occur on every cycle and follows the evaluation of all inputs.

In the straightforward case, the entire design is evaluated anytime there is a change to a clock signal. Only those sequential devices sensitive to the particular edge of the clock are enabled during the cycle. All combinatorial processes are evaluated on every cycle to update outputs to the latest value.

Certain optimizations may be applied. For example, if it is known that there is no sequential device conditional on the negative edge of a clock, a simulation cycle corresponding to the negative edge is not required. Similarly, if there is a single clock, the two cycles may be coalesced by evaluating the affected components of each phase in order. Also, combinatorial processes need only be run if one of their inputs change. Such processes can be grouped into "update cones" conditional on a small number of inputs (e.g., a single clock); members of the group are only evaluated during a cycle if the cone is activated. Further, a simulation cycle may also be run in response to a user/host initiated change to a program variable. In this case, sequential devices are not enabled (unless the variable changed is a clock). Only the combinatorial processes are run to update their values.

Translation of Clock Generation

In one or more embodiments of the invention, a multi-clock source circuit is normalized into a single-clock circuit by synchronizing the circuits logic elements using a global clock that represents the union of all the edges of all clock sources. The use of such a global clock allows for a complete sequential simulation of the circuit without the need for partitioning the circuit into multiple clock domains.

A virtual simulation cycle is implemented that is based upon the clock edges of each clock signal in the simulated design. All clock signals are defined in terms of a global clock. For symmetric clocks (i.e., 50% duty cycle), behavior may be defined by an initial logic value, a delay time to first edge, and a constant delay time to each edge after the first. For instance, in FIG. 13, symmetric clock signal (1301) has an initial logic value of "0", a delay to first edge of one time unit, and a delay to all subsequent edges (i.e., half-period) of eight time units. Thus, the signal has a rising edge at time t=1, and toggles every eight time units thereafter.

For an asymmetric clock signal (i.e., duty cycle other than 50%), behavior may be defined by an initial logic value, a delay time to first edge, a time1 and a time2. Time1 represents the delay time after the first edge when the signal toggles logical values (the second clock edge). Time2 represents the delay time after the second clock edge when the signal toggles once again (the third clock edge). The delay times, time1 and time2, are applied in an alternating fashion thereafter to implement an asymmetric clock signal. Asymmetric clock signal (1300) has an initial logic value of "0", a delay time to first edge of three units, time1 of seven units and time2 of three units.

Figure 13:
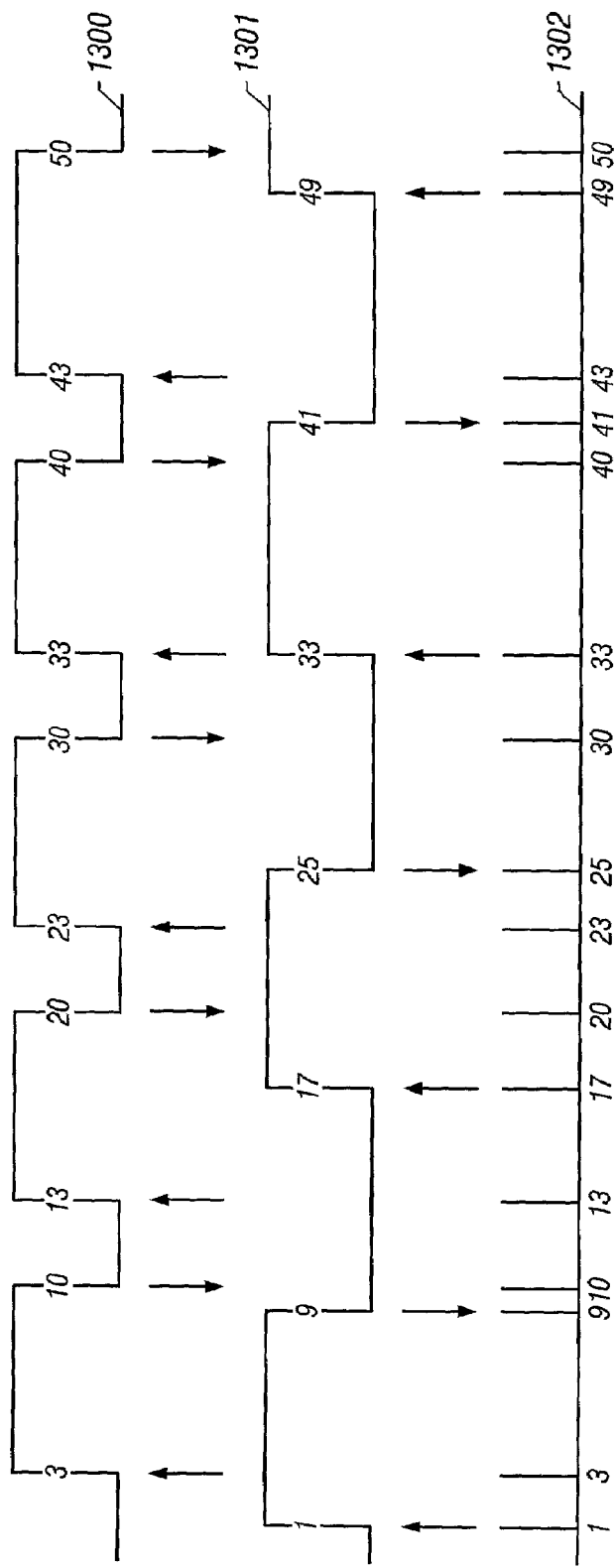
FIG. 13 is a timing diagram of a multiple clock domain simulation clock in accordance with an embodiment of the invention.

For single-pass cycle-based simulation, the component code is evaluated at each clock edge so that any sequential logic triggered by a clock edge event is executed along with any relevant combinatorial logic. The effect is to create a global simulation clock that represents the union of edges of all defined clocks, The intervals (which may be irregular) between the events in the global simulation clock are referred to as a virtual simulation cycle. In FIG. 13, the global simulation clock is represented by signal (1302). Signal (1302) shows a pulse corresponding to the occurrence of a clock edge in any one of the constituent clock signals (1300 and 1301). Each pulse represents the triggering of the simulation logic.

Figure 14:
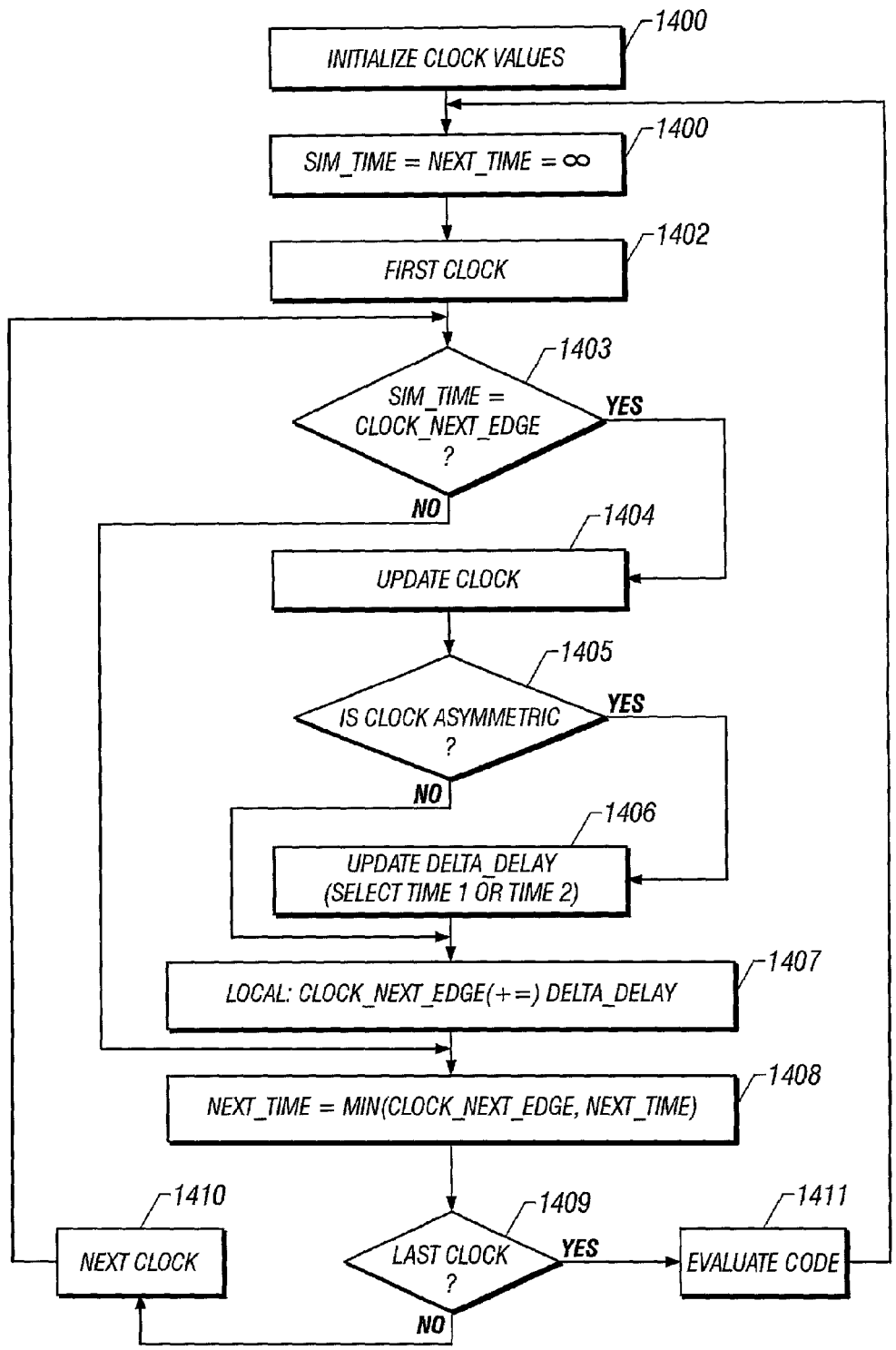
FIG. 14 is a flow diagram of a clock generation implementation in accordance with an embodiment of the invention.

FIG. 14 is a flow diagram illustrating a clock generation process in accordance with one or more embodiments of the invention. The global simulation clock is represented by advancing a simulation time value (sim_time). Each new value of sim_time corresponds to a pulse in a signal. Each clock signal in the circuit has a clock logic state that is toggled when a sim_time variable matches a clock_next-_edge variable (one copy for each clock). The clock_next-_edge variable holds the time value of the next clock edge for that clock signal. A delta_delay value represents the current delay time between clock edges for a given clock (constant for symmetric, toggling for asymmetric). At the end of each simulation pass, the variable next_time is set to the minimum of all clock_next_edge values for the different clocks in the design. Next_time (which is initially set to zero) becomes the new value of sim_time on the next cycle.

In Step 1400, the clock values are initialized. This initialization includes setting the current logic state of the clocks, the respective clock_next_edge for each clock, and the initialization of the next_time to zero. In Step 1401, the sim_time is set equal to the value of next time establishing the time of the current cycle. In the sane step, next_time is set to a value that is larger than any possible clock_next-_edge value. The first clock is selected for evaluation in Step 1402.

If sim_time matches clock_next_edge for the current clock signal (indicating a clock edge) (Step 1403), the clock signal is updated (Step 1404) and the local clock_next_edge is updated by adding the delta delay value (and random jitter if desired) (Step 1407), if this is not an asymmetric clock. Step 1405 tests whether this is an asymmetric clock. If the clock is asymmetric, the value of delta_delay is toggled (Step 1406). After Step 1407, or Step 1403 if there was no clock edge, the global next_time value is updated (Step 1408). This update involves replacing next_time with the current clock's clock_next_edge, if clock_next_edge is smaller than the current next_time value.

If there are clocks remaining to evaluate (Step 1409), the next clock is selected (Step 1410), and the process returns to Step 1403. If the last clock has been evaluated (Step 1409), the rest of the simulation code is executed (Step 1411) before returning to Step 1401.

Variable Initialization

State variables (i.e., variables set by sequential components) and external inputs to the design may be set by an external source (e.g., a simulation control system). In an HDL program, such variable changes are propagated throughout the program to achieve consistent steady state values. For instance, in the continuous assignment "x=y=1", modification of the variable y requires a corresponding modification to the variable x, or the design state would be inconsistent.

Propagation of value changes can be performed by the following process:
1. Modify the value of a set variable;
2. Modify next_time to the current value of sim_time; and
3. Run a single simulation cycle.

These steps cause re-evaluation of all simulation variables and effect changes to variables dependent on the modified variables. Step 2 causes the simulation cycle to be run without advancing the global clock, and prevents clock changes that cause other state variables to change. Next_time is re-calculated by the simulation cycle and does not need to be restored.

This technique also allows interactive clocking of the design by setting/clearing external inputs. For example, a "reset" signal or scan clock may not change during the normal course of a running simulation, but the user may desire to manually pulse such signals. The circuit re-evaluation detects an edge on such signals and cause sequential devices sensitive to the signals to be updated.

Component Intermediate Form Generation

Referring now to FIG. 12, in Step 1202 intermediate form instructions to evaluate the design components are generated sequentially by traversing the components in the sorted order established by the design analyzer. Basic instruction generation for statements and expressions are performed using techniques well known to those skilled in the art. Processes unique to Verilog HDL simulation, or for execution on a MIMD processor are now described.

Translation of Component Processes

"Continuous assignments" are classified as combinatorial components, and are evaluated in the execution order determined by a front-end of the compiler. For sequential components, the event control is evaluated. In one embodiment of the present invention, three cases are of interest to the compiler, including:

Always beginning with edge-sensitive event control: always ⊙(pos/negedge clk)/* body */
Always beginning with delay control: always #N /* body */
Always beginning with an implicit event (e.g., a variable change event): always ⊙(v)/* body */

The first (pos/negedge) case is the most common. Delay control is used for explicit clock generation. Variable change events may not be required, but are easily supported.

For cycle-based code, the compiler does not handle event identifier events, "wait" statements, "always" without any event or delay control in its body (this is a 0-delay infinite loop, and is an error), and procedural event and delay control that suspends execution of a process.

"Initial" constructs are executed once, and only once, during the simulation run. Although not strictly required by Verilog, the code segment for initial constructs are scheduled to occur before all other user code segments. This insures that variables are properly initialized.

An initial construct may be interpreted as follows:

```
this_executed = 0;
if (this_executed == 0) {
    /* initial body */
    this_executed = 1;
}
```

The hidden state variable, this_executed, is unique to each initial construct, and is initialized to zero by the loader. As an optimization, if an initial construct contains only assignments (including blocking and non-blocking), then the assignments can be converted to initialization directives to the loader.

If the "always" construct begins with delay control (#N), the body is executed periodically whenever the simulation time becomes 0 mod N. In effect, such constructs generate the explicit clock periods of the simulation. "Always" constructs are implemented as follows:

```
initially delay_timer_N = 0;
if (sim_time >= delay_timer_N) {
    /* always body */
    delay_timer_N += N;
}
next_time=min (next_time, delay_timer_N);
```

The hidden state variable, delay_timer_N, is common to all "always" constructs having the same delay control value (#N), and is initialized to zero by the loader. The next_time variable is the same as that used in the clock generation logic in Steps 1400–1411 as shown in FIG. 14.

If the "always" construct begins with pos/negedge event control, then it is implemented as follows:

```
clk_event = pos/negedge (clk, last_clk);
last_clk = clk;
if (clk_event) {
    /* always body */
}
```

The hidden state variables (clk_event and last_clk) are common for all instances of each unique direction/item combination.

Implicit variable change events detect any change to a variable value. In cycle-based simulation, it is assumed herein that a variable changes on every cycle. Thus, any block that is controlled exclusively by implicit events is evaluated every cycle and no instructions need to be generated to test for the variable change case. If a variable change event is combined with an edge-sensitive event control, (e.g., ⊙(posedge clk or reset)) it is necessary to evaluate the change event using the following instructions:

```
var_event = (var != last_var);
last_var = var;
if (var_event) {
    /* always body */
}
```

The hidden state variables (var_event and last_var) are common for all instances each unique item tested.

Deferred Assignments

A blocking assignment is completely executed in the normal sequential order of its parent construct. A non-blocking assignment is defined by Verilog to occur after all other events in the same time-step. In an embodiment of the invention, the evaluation of a non-blocking assignment is split into two parts. The right-hand-side (RHS) is evaluated in the normal sequential order in which it is encountered during execution of its parent construct. The RHS value is placed in a temporary, and the actual update of the lefthand-side (LHS) destination is deferred until after all other components are evaluated in the simulation cycle.

```
            q <= data;
becomes:
            tmp = data;
            /* Complete execution of all other
            simultaneous sequential components. */
            q = tmp;
```

When there are multiple sequential components containing deferred assignments (non-blocking assignments or blocking assignments with delay control), the variable updates follow the evaluation of the sequential components and come before the evaluation of combinatorial components. This rule is necessary to insure that the combinatorial components receive the correct value.

Intra-Assignment Delay Control

The translator does not handle any Verilog delay control constructs in an assignment statement. These constructs are not consistent with cycle-based simulation.

Translation of Registers, Nets and Ports

Program variables are those elements declared within the design modules (e.g., reg, wire, etc.). Only program variables that are live between simulation cycles (i.e., carry a value forward from one cycle to the next) need a stored value on a cycle boundary. Variables that are computed and then last used in the same cycle can be allocated to temporary, reusable storage.

In the case of flip-flops and latches, both the data input and the state variables (i.e., both the last and next values of the flip flop) are live between simulation cycles. The compiler supports directives that allow all variables in a module hierarchy to be saved so that they may be examined at a cycle boundary. The only values that should be initialized are those variables that are live between simulation boundaries. This is the same set that is saved and restored to save the state of the running simulation. One way to initialize live variables is to assign the variables within initial blocks. The compiler may attempt to fold constant assignments in the initial block into register and memory state initialization so that they are "pre-initialized" upon loading.

Alternatively, the user may initialize the values after loading using a simulator script. Users often prefer to only initialize the state variable of a sequential device, not the data input as well. The variable initialization process previously discussed is applied to effect this initialization.

Any program element, (i.e., a register or wire), has a bit width. This width is used to determine its layout in memory. Elements that are stored in registers are stored in the actual number of bits specified. If a program variable larger than a register is to be stored in the register file, then the variable is split into multiple parts, each of which can fit in a register.

The individual bits of a register need not be allocated contiguously. The code generation may partition a register into sub-segments that are independently allocated. Usually, register variables that fit into a physical register (e.g., values of 32-bits or less) would not be segmented, although this is permitted. Tri-state nets may have multiple drivers. Design elaboration may introduce a "phantom gate" that resolves the multiple drivers. The inputs to this gate are the drivers on the original net while a new output net is introduced that drives all receivers.

In a four-state simulation, resolution follows the rules defined for the declared type of net (e.g., tri, wand, wor, etc.). Logic strength modeling can be optionally performed.

In two-state simulation, resolution is performed as in four-state, but the output of the resolving gate should be either 0 or 1. If the output of the resolving gate contains a Z or X, then an error is reported back to the host.

If a top-level module has ports, then they are the primary input/output nets for the module. Upon initial compilation, primary inputs/outputs are unattached, Two methods may be used to handle the primary input/outputs. One method involves physical locations being assigned for the nets, and left accessible to the host processor. This allows the user to manually set the values and/or observe their values. The values are updated using a simulator script as previously described. This technique is useful for simulation of an incomplete design, or for simulation on conventional architectures. On the MIMD system, a second method involves the primary input/output nets being linked by messages that are passed across the interconnect. Upon initial compilation of a separately compiled module, sends and receives for these nets are unmatched. That is, no messages are created. When multiple compilation units are combined in a process called linking, the sends and receives are matched and messages are generated.

A primary output is kept live at a simulation cycle boundary, and may be examined from the host. The compiler generates a linker request to generate a broadcast message carrying the value of the primary output, and attempts to generate the value as early as possible in the schedule.

The compiler handles a primary input by generating a receive operation. The linker matches this to the broadcast of a primary output. There should be a match for the linked program to execute. This operation is scheduled for the latest possible availability to avoid delaying program execution to wait for the value.

If the only elements of a separately compiled module form a combinatorial path from primary input to primary output, then the compiler generates the shortest possible schedule with the primary inputs assumed to be ready at time zero. When such a module is linked with other modules, the linker defers execution of the code to the cycle at which the primary inputs are available by inserting a wait statement.

Memory Accesses

Verilog permits the user to define arrays of registers for the purpose of modeling RAMs, ROMs, CAMs, etc. An array declaration is of the form: reg[fb:1b] name [fi:1i]. Memory reads and writes are described by indexed assignments (e.g., name[i]).

The array is stored in memory as a column of rows. A row corresponds to the data for a single element ("register") or ("word"). The column contains the rows for each successive memory element, beginning with the element for the first index (fi).

The range of valid indices for an array is from fi to li. Both of these two values must be constants, but fi may be greater than li. The address of the $i^{th}$ element of the array is:

```
array_base_address + (I - fi) * rowsize // if (fi <= li)
array_base_address - (fi - I) * rowsize // if (fi > li)
```

Because the values (array_base_address, fi, and rowsize) are compile time constants, they can be factored out leaving only the second line to be computed at runtime:

```
const_array_base = array_base_addres +/- fi * rowsize;
addr = const_array_base_address + /- (I * rowsize)
```

For the MIMD environment, there may be several types of memory. For example, the local processor memory may contain 8 KB of data, of which approximately ¼ is used for instructions. The per-chip memories may contain 2 MB of memory. The extended memories may have at least 64 MB of memory. The per-chip and extended memories are accessed via the interconnect. Thus, the compiler considers the total size of the array to determine where to allocate the array.

In addition, there is only one memory access to these memories per instruction cycle. If there is a maximum number of instructions per simulation cycle (e.g., the maximum number of entries in a sequentially accessed static routing table), that maximum serves as an upper limit on the number of memory accesses (reads or writes) that may occur during any given simulation cycle. In practice, the limit is much smaller: first, local memory accesses are interspersed with instruction accesses; second, the per-chip and extended memories may require multiple cycles to access; and third, there is time left over to do other operations. Thus, in some cases, the compiler arranges to partition the memory to allow sub-arrays to be placed on different processors.

Arrays are first partitioned into multiple columns, by splitting each row (element) on a natural data type (i.e., 32-bit) boundary. Each memory column can be assigned to a different processor. For example:

```
reg [0:127] Amem [0:1023]
    can be rewritten as:
        reg [63:0] x;
        int i;
        word = i >> 5;
        bit = i & 31;
```

Note that this transformation both reduces the amount of storage in a single sub-army and the number of parallel memory accesses to the array that can be supported. Each section only performs those accesses that are known to refer to the section. If a bit field spans a split point, then the bit field is reconstructed by concatenating the sub-fields from two different arrays. As an advanced optimization, the compiler can analyze actual usage and split the array only where their are no (or few) overlapping field accesses. Another advanced optimization allows memory to be further partitioned into subgroups. If all the indices are of the form (i*n+m) where n>m, then there is a distinct partition for each m.

In the rare case where bit field selects within a row are variable, the field can only be 1 bit wide. The compiler divides the bits of the select value in a word offset and bit offset. Assuming 32-bit words:

```
reg [63:9] x;
int i;
word = i >> 5;
bit = i & 31;
```

When reading a field with a variable bit select, the compiler uses a mux operation to select the correct word, then a bit extract (or shift) operation to select the bit within the word. For example:

```
result = x [i] ;
result = if    (word == 0)
         then ( (x [31:0] >> bit) & 1)
         else ( ( x [63:32] >> bit) & 1)
```

When writing to the field, the compiler constructs a single word bit mask using the bit offset, and then writes to each word conditionally upon the word select:

```
mask = (1 << bit);
if (word == 0) x [31:0] = x [31:0] | mask;
if (word == 1) x [63:32] = x [63:32] | mask;
```

In the case where the memory is only indexed by values found to be constants at compile time, the memory can be partitioned into individual rows (it may be necessary for the compiler to perform loop unrolling, constant folding and other optimizations to make this determination). For example:

```
reg [31:0] mem [0:1]
    mem[0] = . . . ;
    mem[1] = . . . ;
can be rewritten as:
    reg [31:0] mem0
    reg [31:0] mem1
    mem0 = . . . ;
    mem1 = . . . ;
```

If all indices are constant, partitioning to single rows is the optimal strategy as it allows the compiler to place each row on a different processor, and to schedule the memory accesses with complete freedom.

Four State Expression Evaluation

The translator supports four-state simulation in which bits have a high-impedance and undefined state, as well as 0 and 1. Four-state operations are simulated, for example, by a combination of expansion into two-state operands and use of special instructions in the MIMD architecture that accelerate four-state simulation. Ono skilled in the art can appreciate that while expansion into two-state operands are common, expansion into three-state operands is also possible.

Four-state operations include, for example, the following Verilog constructs: wire; wire-or; wire-and; tri0, tri1; and bufif0, bufif1, notif0, notif1.

In the instruction set for MIMD architecture, there is special support for four-state operations, including an instruction to perform the conditional selection ("?") operator, and the SIMD instruction set, which allows code to perform multiple operations on parts of a register simultaneously, and condition set/reset forms of ALU operations.

Four-state is computationally more complex and reduces the effective performance and/or capacity of the MIMD engine. For this reason, the compiler supports a two-state simulation mode, as well. Users may select which modules of the design require four-state operation and compile those modules accordingly, compiling the rest of the modules in two state mode.

With respect to value representation, Verilog defines four states for each bit. The MIMD system represents each bit as a pair of physical two-state bits: {t0,t1}. The assignments are as follows:

TABLE 1

Four state value encoding

| Value | t1 | t0 |
|---|---|---|
| 1'b0 | 0 | 0 |
| 1'bX (undefined) | 1 | 0 |
| 1'bZ (high-impedance) | 0 | 1 |
| 1'b1 | 1 | 1 |

This particular encoding has unique properties that produce more efficient code. Code sequences for individual operations are described below.

Multi-bit values may be stored in one of two forms:

(1) Each successive bit may be interleaved. Thus in a 2-bit, four-state value the bit order is {t0 [0], t1 [0], t0 [1], t1 [0:1]}.

(2) The t0/t1 bits may be stored adjacent to one other so that the containing storage element is split into halves, with the to bits in one half and the t1 bits in another. Thus, for the same 2-bit four state value: {t0 [0:1], t1 [0:1]}. The individual halves may be aligned on natural storage divisions for efficiency.

The SIMD instruction is optimized to process four-state operations in both of these forms. Option (2) is optimal in conventional architectures, such as SPARC and the general purpose computing environment described in connection with FIG. 1.

The gate-level and net-level primitives (e.g., wire, wand, wor, bufif0, etc.) are defined to take inputs from the set {0, X, Z, 1} and produce outputs containing all four values. The behavioral level primitives (e.g., &, +, etc.) treat X and Z equivalently on input and produce only values from the set {0, X, 1}. The latter are referred to as three-state operations.

In many cases, the complexity of operations on three-state values (measured as number of instructions in the target architecture) is less if the input and outputs are known to be in the three-valued set. Further, it is relatively infrequent that a four-state value is used as input to one of the three-state operations. Therefore, it is advantageous to convert four-state to three-state in these cases.

The following operation performs the conversion from four-state to three-state. This is equivalent to the Verilog "buf" primitive. This example and all following examples assume the encoding of Table 1;

```
buf(a returns c) {
    c.t0 = a.t0 & a.t1;
    c.t1 = a.t0 | a.t1;
}
```

For the three-state operations, the compiler insures that the inputs are in the set {0, 1, X}, or a four-state to three-state conversion is performed. Examples of Boolean three-state operations are NOT, AND, OR, XOR, XNOR, and the conditional operator ("?").

The not function is a three-state operation that simply complements and swaps the t0/t1 halves. For example:

```
not(a returns c) {
    c.t0 = ~ a.t1;
    c.t1 = ~ a.t0;
}
```

The bitwise AND and OR operations are three-state operations and may be performed by applying the base function to the t0/t1 bits pairwise. For example:

```
and (a, b returns c) {
    c.t0 = a.t0 & b.t0;
    c.t1 = b.t1 & b.t1;
}
```

XOR/XNOR is one of the computationally most complex operations in four-state. The sequence below operates on three-state inputs. A version that accepts four-state inputs takes one more instruction, which is more efficient than performing three-to-four state conversion on the inputs. For example:

```
xor (a, b returns c) {
    l0 = (a.t0 & ~b.t1);
    j0 = (~a.t1 & b.t0);
    l1 = (a.t1 & ~b.t0);
    j1 = (~a.t0 & b.t1);
    c.t0 = l0 | j0;
    c.t1 = l1 | j1;
}
```

The conditional operator ("?") (i.e., a two input mux) uses a special truth table if the select value is undefined. If the select is undefined, then the two inputs should be the same or the result is undefined. If the select is known to be a two state-value, the operation can be performed as a simple mux instruction. If all three operands are three-state, then a special mux instruction is defined that forces the result to X if the select is undefined and the a and b operands are different. For example:

```
cond (s, a, b returns c) {
    c.t0 = (a.t0 & ~s.t1) | (b.t0 & s.t0) | (a.t0 & b.t0);
    c.t1 = (a.t1 & ~s.t0) | (b.t1 & s.t1);
}
```

If any of the operands are four-state, then input conversion is performed on the operands first.

According to the IEEE (Institute of Electrical and Electronic Engineers) Verilog Specification (IEEE Standard 1364-1995), the output of an integer arithmetic operation is undefined if any of the operands contains an undefined. For example:

```
add_ieee (a, b returns c) {
    u1 = (a.t0 != a.t1);
    u = {b.t0 != b.t1} | u1;
    c.t0 = (a.t0 + b.t0) & ~ u; // conditional reset
    c.t1 = (a.t1 + b.t1) | u; // conditional set
}
```

The last two lines of the above example illustrate where the conditional set/reset instructions may be utilized to optimize 4-state operations, in accordance with one embodiment of the invention that utilizes the MIMD simulation format.

An alternative, which may be more useful to the user is to detect bits that are affected by X's. This can be approximated by performing the operation pairwise, and then converting mismatched bits to X's:

```
add_strong (a, b returns c) {
    c.t0 = a.t0 + b.t0;
    c.t1 = a.t1 + b.t1
    c = buf (c);
}
```

For an integer shift operation, if the shift count contains an unknown bit, then the result is unknown, otherwise, it is the value, shifted by the count. For example:

```
shift (a, b returns c) {
    u = (b.t0 != b.t1);
    c.t0 = shift (a.t0, b.t0) & ~u;
    c.t1 = shift (a.t1, b.t1) | u;
}
```

With respect to comparisons, and more specifically, relational operators, a relational test yields an unknown result if either operand contains an unknown. For example:

```
greater_weak (a, b returns c) {
    u1 = (a.t0 != a.t1);
    u = (b.t0 != b.t1) | u1;
    c.t0 = (a.t0 > b.t0) & ~ u;
    c.t1 = (a.t1 > b.t1) | u;
}
```

The IEEE standard states that the result is unknown if the presence of an unknown bit in either operand renders the result ambiguous. Thus, high-order bits may dictate the result, regardless of low-order unknowns. Below, the key test is to compare a.t0, which has a zero in any bit position that has an X, and b.t1, which has a one in any bit position that has an X. If a.t0>b.t1, there is a one in "a", that has more significance than any 1 or X in "b". If this is true, then the result is necessarily true. The condition is false if the test fails, and there are no X's in either operand. Otherwise, the result is undefined. For example:

```
greater_strong (a, b returns c) {
    u1 = (a.t0 != a.t1);
    u = (b.t0 != b.t1) | u1;
    c.t0 = a.t0 > b.t1
    c.t1 = c.t0 | u;
}
```

The IEEE standard states that the result of an equality comparison is undefined if either a or b has an undefined bit. For example:

```
equals_ieee (a, b returns c) {
    u1 = (a.t0 != a.t1);
    u = (b.t0 != b.t1) | u1;
    c.t0 = (a.t0 == b.t0) & ~ u;
    c.t1 = (a.t1 == b.t1) | u;
}
```

However, the test used by commercial simulators is to have an unequal result if any bit pairs are known to be undefined. As an option, if compatibility is required, this test may be implemented by a compiler option. Thus, the code generator may do bitwise equality checks (XNOR), and produce a false result if there are any zeros; true if all are ones; and undefined otherwise. For example:

```
equals_cs (a, b returns c) {
    t = xnor (a, b)
    c.t0 = (& t.t0); // (t.t0 != -1)
    c.t1 = (& t.t1); // (t.t1 != -1)
}
```

Verilog dictates that the "then" part of an "if" statement be taken if, and only if, the expression has a non-zero known value. Thus, if an expression has X or Z bits, then the "else" part is taken.

Notice that the "else" part is not simply executed on the logical complement of the "if" expression. The complement may have undefined values, too. Thus, when doing predicates for control conversion, the code generator implements special tests that yield a two-state value—true if the "then" part is to be taken, and false otherwise.

If the test is a non-relational expression, the standard interpretation is (e!=0). But, a test is still needed that can produce a two-value:

```
thenEnabled (e returns c) {
    t = e.t0 & e.t1; // 0's for any bit locations with 0, X or Z
    return (t != 0)
}
```

Observe that if there is no Z-term on input, (i.e., the input is known to be three-state), then the test is simply:

```
thenEnabled (a returns c) {
    return (a.t0 != 0)
}
```

If the test is a relational, evaluation is done in special ways so that the result is two-state, equivalent to:

```
((a relop b) === 1'b1)
```

Casez and casex statements are like case, but have a special equality test that ignores the Z (casez) or Z and X bits (casex). The action required is to identify the don't care cases; mask the bits in the operand, and then perform a test for equality (using ===, not ==). The following implement the corresponding truth tables:

```
testcasez (a, b returns c) {
    t1 = a.t1 & b.t1;
    t2 = b.t1 & ~ b.t0; // omit if B does not contain Z
    t3 = a.t1 & ~ a.t0;
    t4 = a.t0 & b.t0;
    t5 = t1 | t2;
    t6 = t3 | t4;
    t7 = t5 | t6;
    return (t7 != 0);
}
testcasex (a, b returns c) {
    t1 = a.t0 ^ a.t1;
    t2 = b.t0 ^ b.t1;
    t3 = ~ (a.t0 ^ b.t0)
    t4 = t1 | t2;
    t5 = t3 | t4;
    return (t5 != 0);
}
```

Predicates for Control Conversion

In one embodiment of the present invention, Verilog control flow structures are converted into predicates for individual predicated instructions. As applied here, predicates for control conversion are applied during translation to produce the final, branchless form in a single pass. Alternatively, translation could produce intermediate form instructions containing branches. Then, predicates for control conversion are performed as a sub-, sub-phase of code generation. The latter approach is more suitable for use with conventional target architectures.

System Tasks and Functions

Some Verilog-defined functions and system tasks are handled by the compiler and executed directly on the simulation platform. All remaining cases, and user-written tasks and functions are executed by code running on the host processor. If the simulation platform is a normal sequential processor, the compiled code running on the simulation platform simply collects the arguments for a task or function into a parameter block, and signal the host processor that there is work to be done. However, due to its highly parallel nature, suspending operation on every call in the MIMD system environment is desirable.

For this reason, all system and user-defined tasks are queued for execution between simulation cycles, using values saved at the logical point of execution. The Verilog defined system tasks can be executed this way with no change to the language semantics. However, user-written tasks are written to understand that execution may be delayed until the end of the cycle.

When user-written functions should be evaluated during the simulation cycle (their values are used within the cycle), the simulation platform generates code to suspend the simulation and wait for the returned value. It is possible to batch such calls to reduce overhead.

The compiler collects the following information for each PLI call:

1. A reference to the condition variable used to determine if the call is made. For a call that is always made, this is a constant.
2. The static order number for the call. This serves as a unique identifier for the call within a compilation, as well as determining the order in which calls are executed when more than one is enabled.
3. The name of the system task or function called.
4. An entry for each parameter. Because system calls may have many different kinds of parameters, there are several possibilities. All entries specify the type and possibly the size of the parameter, so the following list only discusses the additional information supplied:
    a. For a logical value, the location of the value.
    b. For a constant of any kind, the value of the constant.
    c. For a reference to a module instantiation, the full name of the instantiation.
    d. The direction of dataflow, into the function, out of the function, or in both directions. Note that this is not part of the Verilog language, but is additional information allowed by the compiler to improve performance.
5. For a function, an additional parameter provides the address, size, and type of a variable to receive the return value.

This information is entirely static, and is not inserted in the executable code. Rather, it is written into the symbol file for use by the runtime environment. The correspondence between the function call and the symbol file information is provided by the static order number.

Code Generation

With reference to FIG. 4, the back-end of the compilation process occurs at Step 405 wherein the HDL code, which the compiler has transformed into an intermediate form in Steps 401 and 403, is further converted to a machine-dependent form that is able to execute on a target computer system.

For most hardware designs, there is substantial parallelism in the sequential program after predicates for control conversion is performed. If the target simulation system is a massively parallel architecture, such as the MIMD architecture, embodiments of the code generator, schedule and partition the program into threads for parallel execution on individual processors. Mechanisms, referred to as partitioning and routing, place threads in specific processors and route messages between the respective processors for proper execution of the threads.

Figure 15:
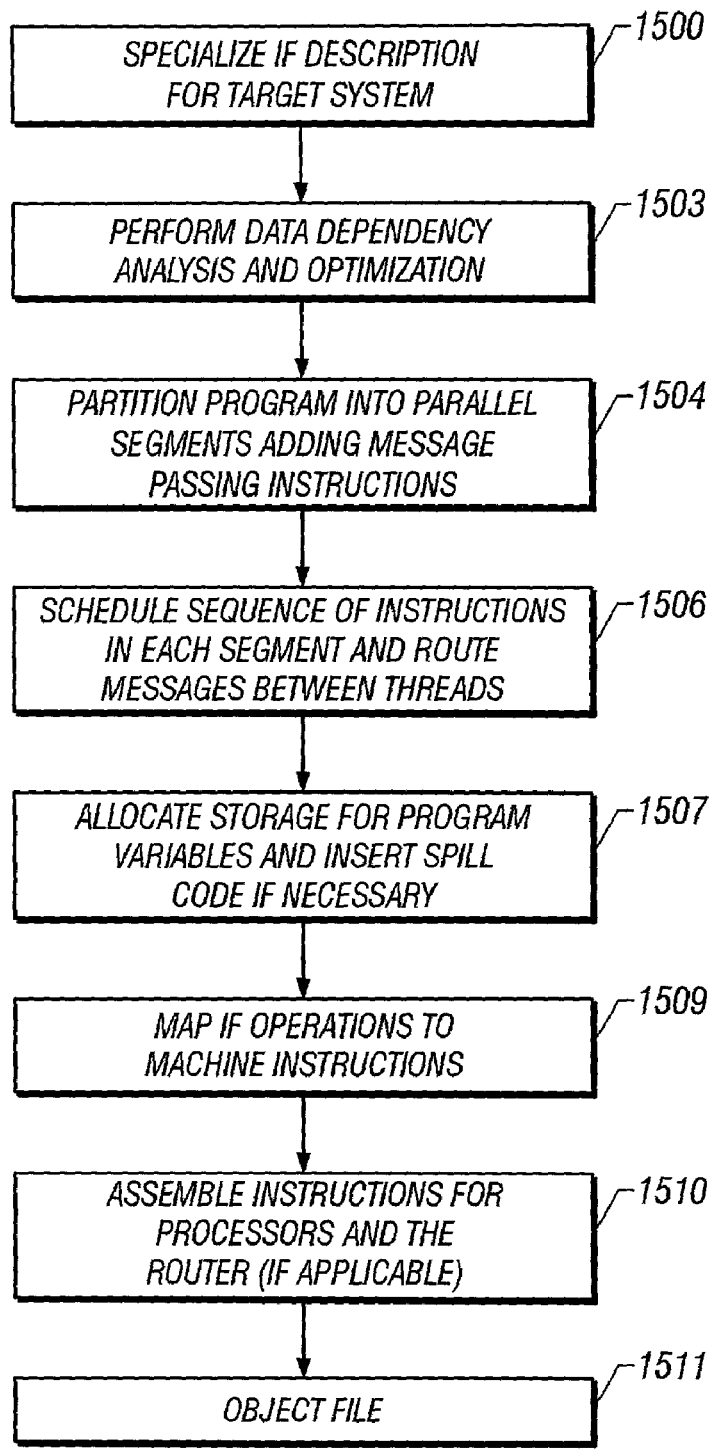
FIG. 15 is a flow diagram of a code generation process in accordance with an embodiment of the invention.

The conceptual flow of processing for code generation in accordance with an embodiment of the invention is described below with respect to FIG. 15. Certain of the phases may execute simultaneously as co-routines of a single algorithm. In Step 1500, the "if" description is specialized to expose the native operations of the target machine. Where possible (e.g., where complex instructions can be used), this step may include combining multiple "if" nodes to form a single native machine operation. The "if" description undergoes data dependency analysis (Step 1503), as well as optimizations such as forward and backward flow optimization, vectorization and data partitioning. The program is partitioned into parallel segments (Step 1504). In one or more embodiments, each segment corresponds to a MIMD processor, or a Solaris thread. Message passing operations are added to move data from one unit (or thread) to another and the geometric placement of the thread within the MIMD array is assigned. To minimize computation time in multiprocessor systems, a computation may be replicated instead of passing the value resulting from a computation from one segment to another.

The sequence of instructions in each segment is scheduled to minimize processing time and message routes are generated (Step 1506). The code generator allocates storage for the program variables, inserting spill code as necessary (Step 1507). The "if" operations are mapped to actual machine instructions of the target simulation system (Step 1509). The instructions are assembled for execution by the processors (Step 1510). An object file representing the process constructs of the simulation is ultimately created for execution on the target system (Step 1511).

The above steps in the process of code generation are described in more detail below. The following sections describe implementation of the intermediate form description, in accordance with an embodiment of the invention.

Intermediate Form Description

Referring back to FIG. 4, the intermediate form (404), which comes as a result of the translation phase (403), is a data structure that represents the simulation program as a sequence of idealized instructions. The code generation process transforms the intermediate form to actual machine language, binding intermediate form operations to actual machine instructions, and intermediate form variables to relocatable or physical addresses in the target machine. A single intermediate form description is used throughout code generation from translation to optimization to scheduling to object file emission.

The intermediate form is a representation of machine operations, and is language independent. It has no knowledge of the data structures used by the front-end of the compiler. In principle, it could be used for C language, as well as for Verilog, or any other suitable programming language.

Embodiments of the invention support simulation on various simulation processing architectures or platforms. For this purpose, the intermediate form is able to represent programs that may be executed on any of the target platforms. The Verilog to intermediate form transformation generates code for an idealized machine, attempting to use the "highest level" representation of any function. Later, the intermediate form is specialized to represent specific machine-level operations or constraints.

The intermediate form provides data that may be used by complementary back-end phases in a fashion that is easy and efficient to create, inspect and manipulate. The intermediate form is designed to be viewed (i.e., traversed) in one of three ways:

1. As a doubly-linked list of n-tuples representing the instructions to be performed and the order in which the instructions are encountered. The optimizer and scheduler can reorder this list so long as all necessary data dependencies are preserved.
2. As a directed acyclic graph (DAG) representing the operations and their operands. Common sub-expressions may have multiple references. The execution list order is a valid topological sort of the expression tree.
3. As a data dependency graph with edges providing a full cross-reference of the use and definition of all values. Not only does a consumer refer to the producer (as in a normal operator tree), but also, a producer references all consumers of its value.

Machine-Specific Code Selection and Specialization

During the translation phase, the intermediate form for the simulation is created in a machine-independent manner. The next phase to run specializes the intermediate form for the intended target machine (e.g., MIMD, SPARC, or other suitable computer usable medium).

Target-dependent code specialization is performed to convert intermediate form operations into forms that can be directly represented as a single machine operation. Certain nodes, i.e., declarations, constants and "implicit" operations do not map to instructions. Thus, after this phase, the ordered list of intermediate form operations is the list of instructions to be generated.

Specialization performs the following kinds of transformations:

Specialization converts any operation that does not exist on the target machine into a sequence of operations that computes the same result.

Specialization expands multi-precision operations into a sequence using only precisions supported on the source machine.

Specialization expands operations on bit fields of registers to sequences of shift, mask, and width conversion operations.

Specialization generates extra operations to load constant operands that cannot be encoded within an instruction as an immediate form.

Specialization generates instructions to perform partial address calculations for addressing modes that are not supported on the target machine.

Specialization converts operations into equivalent forms that are more optimal for the target machine.

Data Dependency Analysis

Data dependency analysis builds a complete directed acyclic graph (DAG) representing order dependencies among nodes. There are two main kinds of dependencies:

Operand-carried dependencies in which the result of one operation is an input to another. These kinds of dependencies are directly represented in the intermediate form graph.

Memory-carried dependencies that imply an order on read or write operations. These are referred to as read-after-write (RAW), write-after-read (WAR) and (WAW) dependencies (there is no order dependency among a pair of read operations). These dependencies are represented in the intermediate form by augmenting the tree with data dependency edges.

The function of data dependency analysis is to identify memory-carried dependencies and to add the dependency edges. In the most basic embodiment of the algorithm, any reference to a part of a variable (e.g., an element of an array) is dependent on a reference to any other part. However, it is important to disambiguate among references to a part of a variable to maximize scheduling freedom. The compiler distinguishes among non-overlapping sections of a variable when all offsets are constants.

The data dependency process also calculates statistics that are used later in compilation. The statistics include instruction execution latencies, and the earliest and latest start times for each operation, and the available slack (for scheduling).

Optimization

The compiler performs a variety of common optimizations in order to improve the performance of the code that the compiler generates. In addition, the compiler performs certain program transforms specifically designed to increase the available parallelism in the code in order to better exploit the target architecture.

Flow Optimizations

The compiler may optionally perform flow optimizations as listed below. Forward flow optimizations include:

Value and constant propagation;

Common sub-expression elimination;

Tree-height reduction;

Strength reduction;

Algebraic simplifications; and

Combinatorial logic optimizations.

Backward flow optimizations include elimination of dead code (mainly stores and those created as a side effect of other optimizations), and identification of storage target preferences.

Design Compaction

A Verilog design may have many small or single-bit operations, particularly in gate-level simulations. The invention may perform many such operations in parallel using a single register-wide operation, by insuring that the input variables and temporaries are stored in adjacent locations. The main limitation on the compiler's ability to perform this optimization is conflicting demands on the allocation of a variable or temporary. This occurs when the item has multiple uses. Even in such cases, it is possible to reorder input bits using concatenation to enable a design compaction, i.e., "vector" operation. As long as the total number of instructions to concatenate and then perform the operation is less than the number of instructions to perform the operations individually, design compaction is advantageous.

Parallelization

In logic designs there is a substantial intrinsic parallelism (i.e., all physical logic elements actually operate simultaneously in parallel). A software simulation of a physical device can exploit this parallelism to achieve improvements in simulation rate dividing the computational work amongst multiple processors of a multiprocessor system. With very large designs, or multiprocessor systems with small processor capacity, such as the MIMD environment, parallelization of the design may be essential because no single processor alone is capable of holding the simulation instructions for the entire design.

To effectively exploit the parallelism in the circuit, the compiler determines the assignment of each simulation instruction (intermediate form operation) to a particular processor and order of the instruction within its assigned processor. The processor assignment function is termed partitioning, and the ordering function is termed scheduling. The goal of the combined processes is to minimize the runtime required for a single evaluation of the input circuit.

Scheduling is applicable to uniprocessor simulation as well, as it can be used to overlap operations with long (i.e., greater than a single cycle) latency and thereby reduce uniprocessor runtime.

When a computation has been partitioned, there is a need to transfer data from one partition to another. For instance, in the expression (a+(b−c)), if the subtraction has been assigned to one partition and the addition to another, the output of the subtraction operation needs to be transferred to the other partition for use as an input to the addition. Generically, this is referred to as message passing, and may use shared memory or an explicit passing network. The cost of transferring data by message passing is in most systems higher than producing the value and consuming it in the same processor, and the choice of processor assignments affects the communication cost due to asymmetries in the physical organization of the system. Thus, there is an ancillary process to partitioning called placement, which determines which physical processor is to be used.

In the MIMD environment, a statically scheduled passing network is used. To utilize this network, the compiler determines the actual path or route to be used to pass a message from one processor to another, and the instructions to be issued by the routing processors in the interconnection network to affect the message pass. This process is termed routing.

In this environment, the partitioning and placement functions are performed simultaneously. Then the scheduling and routing functions are performed as simultaneous operations.

Partitioning and Placement

Partitioning is an important component to the capacity and simulation performance of a massively parallel architecture, such as the MIMD environment. The partitioning solution is stable, reproducible and of high quality. Further, the partitioning solution obeys the hardware resource constraints on the execution processor and on the routing processor. The algorithms are designed to meet the objectives of minimal communication cost, minimal schedule length, and maximum capacity.

The task of a partitioner, as part of the partitioning solution, is to take as input the intermediate form (IF)graph generated by the data analysis and optimization modules of the compilation phase and assign each IFnode to an execution processor on the hardware. The number of execution processors needed is determined by the partitioner. In an embodiment of the invention, a user can control the utilization of the execution processor through a command line option.

The partitioning algorithm incorporates a bottom-up, multi-level approach. This approach has three main phases: Coarsening, Initial Partitioning, and Uncoarsening and Refinement. The Coarsening phase involves clustering (coarsening) the highly-connected nodes together and constructing superNodes representing feasible processors, subclusters, ASICs, and boards. In the Initial Partitioning phase, these superNodes are assigned to hardware blocks level by level starting from boards to ASICs to subclusters to the execution processors. In the Uncoarsening and Refinement phase, a local refinement step at each level of hierarchy in the hardware may be initiated to get a reduction in communication cost at that level. This process continues until the superNodes are mapped to execution processors. Finally, the IFnodes get mapped to individual execution processors in the system.

The Coarsening phase of the partitioning solution is also an important component to achieve initial good quality partitioning solution. Various heuristics are used in this phase to get lower communication cost, lower schedule length, and higher utilization in the execution processors. As nodes are merged during the coarsening phase, resource limits are obeyed to ensure the generation of a feasible execution processor, subcluster, ASIC, and a board. Any violations are corrected in a subsequent step.

In one embodiment of the invention, the heuristics used may include Heavy Edge Binary Matching, Heavy Edge K-way Matching, Schedule-based Clustering, Random Binary Matching, and Random K-way Matching.

Heavy Edge Matching involves merging two nodes that communicate maximally with each other ensuring that after the merge step, the heavy edges in the input graph have been inside the cluster. This process can be done in a binary fashion where only two nodes are merged and also in a k-way fashion where more than two-nodes are merged until a resulting superNode has been maximally filled or no more edges are left to be absorbed, whichever happens first.

Schedule-based Clustering tries to zero-in the critical path edges in the design. This process tends to reduce the final critical path length of the partitioned and scheduled design.

Random matching involves merging nodes in a pseudo-random fashion so that the utilization of a processor is maximized. A more intelligent, functional clustering approach helps to cluster the nodes based on the available design hierarchy information.

The Initial Partitioning phase involves assigning the superNodes to boards and ASICs. This phase also includes placement optimization for lower congestion in the interconnect and lower average distance traveled by a message in the system. This phase uses a greedy approach to construct an initial placement. The initial placement is refined using swap-based operations to meet established quality objectives. This phase also attempts to balance the input/output across ASICs to help in relieving congestion in the interconnect.

The Un-coarsening and Refinement phase helps to improve the quality of the initial solution produced by coarsening and initial partitioning phases. The nodes are moved locally, under resource constraints, to got lower communication costs. The moves should also obey the routing processor memory limits.

Finally, the IFnodes are assigned to the execution processor to which the parent superNode is assigned and the resources consumed by an IFnode are allocated on that execution processor block.

Message Insertion and Optimization

After partitioning is completed at any particular level, a post-pass is performed in which message passing operations are inserted. In the MIMD environment, a SEND instruction is placed in the producing processor, and a RECEIVE instruction is placed in the consuming processor (in addition to routing instructions that move the data between the processors).

As an optimization, it may be more efficient to recompute a value than to pass its value. In this case, the operation is replicated in this step rather than inserting a SEND/RECEIVE pair. A special case of this optimization occurs when the result of a RECEIVE instruction itself needs to be sent to another processor. The receive operation can be replicated, turning the original send into a broadcast.

Scheduling and Routing

In the scheduling process, the order of simulation instructions is chosen to maximize parallelism and minimize the total runtime of the simulation program. Scheduling considers all nodes (simulation instructions represented as intermediate form operations) in all partitions simultaneously, and thus, schedules all processors simultaneously.

Figure 16:
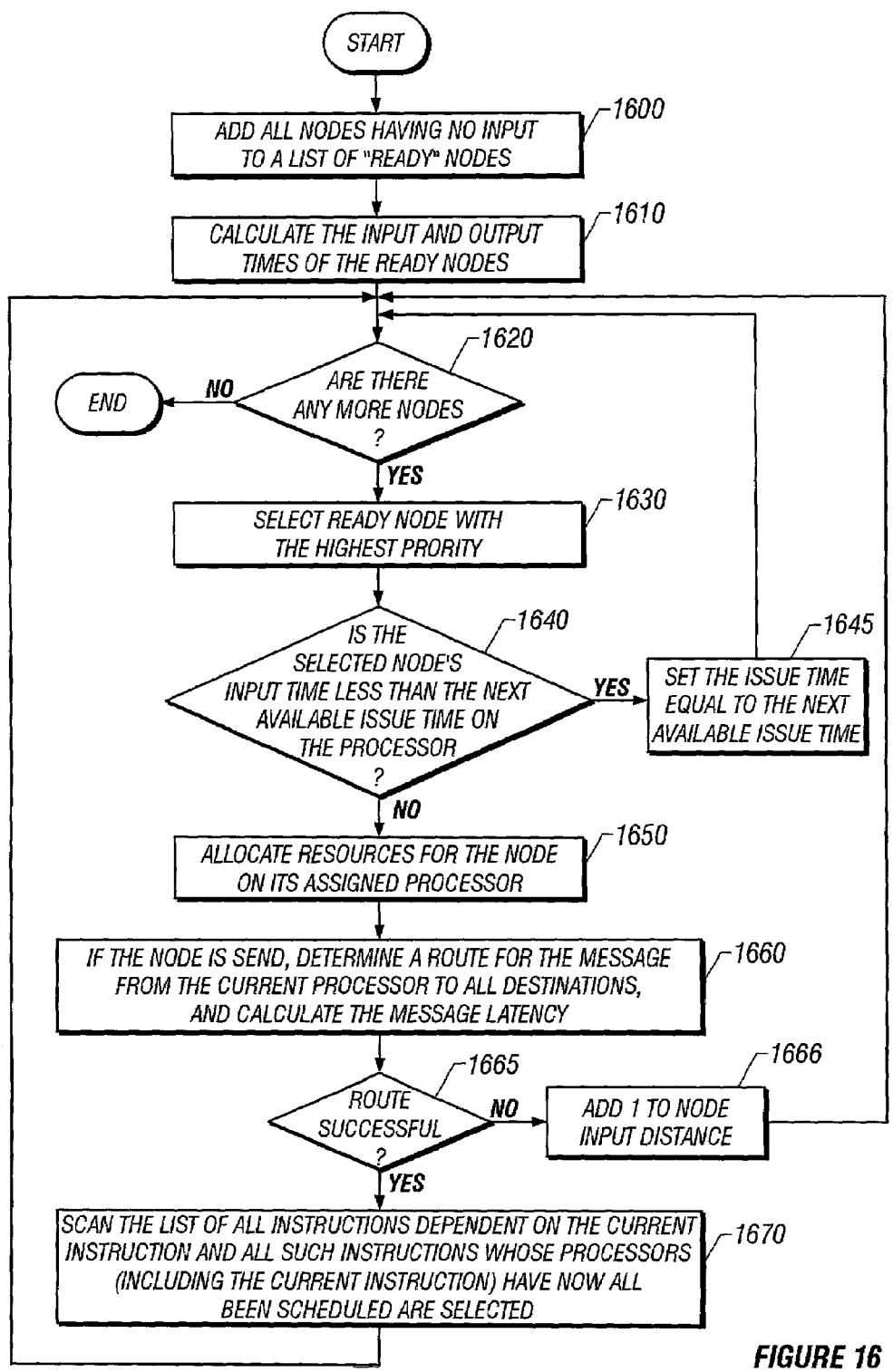
FIG. 16 is a flow diagram of a process for performing scheduling in accordance with an embodiment of the invention.

Scheduling and routing proceed in accordance with FIG. 16. All nodes having no inputs are added to a list of "ready" nodes (Step 1600). The input and output times of nodes on the ready list are calculated (Step 1610). The input time is the distance from input nodes and the output time is the distance to output nodes. Distance is the sum of computation and communication times along a path to the node. At this point, the communication times used are the estimates generated during partitioning. If there is more than one path, the maximum distance is used in calculating the times.

A determination is made whether there are any more nodes (Step 1620). If there are no more nodes, scheduling and routing are complete. If there are more nodes, then the ready node with highest priority is selected (Step 1630). Nodes that have the lowest output time have priority among nodes with the same input times (if not unique, one node is randomly selected).

If the node's input time is less than the next available issue time on the processor (Step 1640), its input time is set to the next available issue time (Step 1645) and go to Step 1620. The next available issue time may be dependent on the type of instruction and the actual utilization of resources (e.g., registers). For some constraints, it may be easier to determine that the instruction is blocked at the current time, than it is to determine the actual next issue time. In this case, assume an issue time of the node's input time+1. If the node's input time is not less than the next available issue time on the processor, continue at Step 1650.

At Step 1650, resources for the node on its assigned processor are allocated. Next, if the node is send, a route for the message is determined from the current processor to all destinations, and the message latency is calculated (Step 1660). This is the actual communication cost. Update the communication time between the send and its destination receives. If a route cannot be found (Step 1665), one (1) is added to the input distance (Step 1666), and the flow returns to Step 1620.

If a route is successful (Step 1665), the list of all instructions dependent on the current instruction (i.e., instructions have an output data dependency edge from the current instruction, as constructed by the data analysis phase) are scanned and all such instructions whose predecessors (including the current instruction) have now all been scheduled are selected (Step 1670). The node times based on the update times of all predecessors are calculated and added to the ready list. Flow then returns to Step 1620.

Instruction Packing

Certain MIMD instructions are capable of executing multiple operations per cycle provided that the outputs can be grouped together and allocated as one unit (e.g., the bool.22 and bool.32 instructions). When two instructions are to be packed together, there should be adequate space to allocate their destinations in adjacent registers. As the operations are processed sequentially, no predetermination can be made that two operations are packed. The best that the compiler can do is to enable the optimization when the first such operation is seen, by giving preference to register destinations that are adjacent to free space.

Except for the above case, all operations are assigned to single instructions, and occupy one cycle. If there are idle cycles between an operation and its immediate predecessor, NOPs or WAIT instructions are inserted to avoid timing hazards in the processor pipeline and in message passing. These instructions are actually inserted when the executable file is generated.

When an operation is assigned to a processor, the input operands are located. If an operand is already allocated on another processor, then a pair of send/receive operations is inserted into the program to represent the exchange of a message. If an operand is unallocated, then it is allocated on the selected processor. Only memory variables or constants are allocated to memory. All other variables are allocated to registers.

Register Allocation

Program variables are divided into three classes:
1. Named program variables, which carry a value from one simulation cycle to the next. These variables are live at a simulation cycle boundary.
2. Named program variables, which are defined and used within a single cycle.
3. Temporary variables used in the evaluation of an expression.

The register allocation strategy is different for each of these classes.

Cycle-to-Cycle Named Program Variables

Named program variables that are live at a simulation cycle boundary are allocated to a location that is reserved for the entire cycle. In principle, the location need only be reserved from the start of the cycle to last use, and from point of definition to the end. However, this increases the computational complexity of the algorithm for what may cause little additional performance benefit. In the interest of reducing compile time, one or more embodiments implement simpler techniques.

Cycle-Local Named Program Variables

Named program variables used exclusively within a single cycle in most cases are eliminated by value propagation. Certain variables may remain. For example, it may not be possible to completely eliminate variables that are defined by multiple separate assignments to part selects. The variables that remain are allocated like the first class above for simplicity.

For debugging purposes and for support of PLI code, these program variables may remain accessible. Under a special compilation option, the compiler retains either all named variables or a designated set (from which other values may be reconstructed).

Expression Temporaries

Expression temporaries are allocated from a pool of temporaries. The lifetime of the temporaries are maintained using a simple usage count method.

Register Targeting

If the temporary result of an expression is later assigned to a variable that has already been allocated, it is possible to eliminate that assignment by allocating the temporary to the same register if that register is free. This is known as a register target preference.

Avoidance of Register Spilling

In compilers for conventional systems, it is necessary to deal with register exhaustion. That is, the situation where there are more simultaneously live values than there are free registers. This case is handled by insertion of spill code (i.e., load and store operations that place values in memory temporarily to make additional registers free).

In the compiler for the MIMD environment, register spilling is avoided. The workload calculation in partitioning accounts for registers that are required, and partitioning is not allowed to create a situation in which there are more register values than there is register space in which to store them. Because of the MIMD architecture with a large number of available registers and the ability to pack multiple values in a single register, the situation would be rare in any event. Should it be necessary to insert spill code (such as for a conventional processor) it is best done simultaneously with scheduling as instructions are selected and processor resources are reserved for the instruction.

Memory Allocation

Program variables and large constants may be allocated to memory. Allocation is performed in two groups: values which are un-initialized and values requiring initialization. The former is allocated to memory, which is initialized as a block to zero. Some memory locations may be reserved (a host communications variable fixed at the highest location in memory, for example).

Object File Generation

The last step of code generation is to generate the executable program containing instructions for the simulation platform (e.g., the MIMD processors in one or more embodiments) and symbol table information. The steps required are:

Inserting data initialization directives;
Inserting padding operations;
Generating the executable file; and
Building the symbol table mapping the HDL source constructs to their physical locations.

Data Initialization

Assembly language statements to initialize register or memory data are also emitted at this time. Program variables are sorted by storage class and address, and then the compiler traverses the variable declarations and output any requiring initialization.

Insertion of Padding Operations

If there are idle cycles between two operations, NOPs or WAIT instructions are inserted at this point to avoid timing hazards in the processor pipeline and message routing.

Generation of the Executable File

The executable file contains machine instructions and the initial data image. Initially, the executable file is created by generating an assembly language source file. The assembly language source file is passed to the assembler, which creates the actual object file. It is also possible to generate a binary file directly.

At this point in compilation, the intermediate form operations correspond in a one-to-one fashion with actual machine instructions to be emitted. It is a simple process to traverse the execution order list of intermediate form operations and emit instructions. The map from intermediate form operations to assembly language instructions is direct. The only complexity arises when there are implicit operands that affect the encoding of the function e.g., AND with an implicit NOT operand.

Annotated Symbol Table (PSF)

The compiler records the physical location where the value of registers and nets have been stored, so that the user interface and PLI routines can determine where to access them within the machine at runtime. An annotated symbol table (e.g., Phaser Symbol File (PSF)) is a file generated by the compiler that provides information used by runtime support code when a simulation is executed. Though PSF is described as a separate subsystem and file, in an embodiment, the PSF may be integrated with other files produced by the compiler.

The data stored in the PSF may be roughly divided into two categories. The first category is abstract data, which describes the structure of the simulation (i.e., instantiation hierarchy) as described in the source code. The instantiation hierarchy is essentially a list of all registers, wires, variables, and other simulation components. The second category is instance data, which describes the mapping of a particular module and component instantiations onto the physical components (i.e., the target hardware) of the simulation. The instance data includes access information describing how to read or write particular values or portions of values.

For each system call that might be executed in a simulation, the following access information requirements exist:

a. Access information for the controlling condition;
b. A unique "priority" assigned to that particular system call;
c. The name of the function to be called;
d. Source location of the particular system call;
e. Information about the type and constant data associated with a particular system call (abstract data); and
f. Access information for each argument associated with a variable.

For each module in the simulation, a description of the abstract characteristics of the module, including source locations of the constructs exist, such as name and connection information (ports), local variables, tasks and functions, inner blocks, information on parameters and port connections (for each module or component instantiated within the module), and descriptions of module code and interconnections (because this only affects some PLI functions, the description can be omitted if certain PLI functionality is also omitted).

For each entry in the list of simulation components, access information requirements include the abstract corresponding abstract variable and the address of each piece of the value. If the value is stored in a single location, then there is one address. If the value is split across processors, each piece is described.

Advantages of the present invention include one or more of the following. The invention provides the advantages of having a large capacity for software simulation, the ability to easily modify a logic design, and flexibility while maintaining acceptable operation speeds. The present invention is scalable, thereby enhancing ability to keep pace with emerging complex and high device count logic designs. The present invention, with large amounts of memory distributed across the system architecture, avoids memory-access latencies introduced when attempting to execute large logic designs. The present invention affords a relatively lower cost than other hardware-assisted simulations. Those skilled in the art appreciate that the present invention may include other advantages and features.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer implemented method for compiling a cycle-based design in a simulation system comprising:
    generating a parsed cycle-based design from the cycle-based design;
    elaborating the parsed cycle-based design to an annotated syntax tree of component objects constituting the cycle-based design;
    translating the annotated syntax tree to a language independent intermediate form; and
    converting the intermediate form to an executable form.

2. The method of claim 1, wherein the cycle-based design represents a hardware description language.

3. The method of claim 2, wherein the hardware description language comprises a hierarchical collection of modules.

4. The method of claim 3, wherein a plurality of variables at different levels of the hierarchical collection of modules represent a common variable.

5. The method of claim 2, wherein the hardware description language is Verilog.

6. The method of claim 5, wherein the cycle-based design comprises a clocked logic design having at least one periodic clock source.

7. The method of claim 5, wherein the cycle-based design allows an initialization of a variable defined by the hardware description language.

8. The method of claim 7, wherein the initialization of the variable is performed by an external control system.

9. The method of claim 1, further comprising:
    representing the cycle-based design in an annotated symbol table.

10. The method of claim 9, further comprising:
    using the annotated symbol table with an external control system.

11. The method of claim 1, wherein converting the intermediate form to an executable form comprises:
    applying predicates for control conversion to transform the intermediate form into a straight-line process;
    mapping at least one node of the intermediate form to an operation of an execution processor;
    applying flow optimization to the intermediate form;
    scheduling the sequence of a plurality of instructions associated with the intermediate form;
    mapping intermediate form operations of the intermediate form to instructions of the execution processor;
    assembling instructions of the execution processor.

12. The method of claim 11, further comprising:
    partitioning the intermediate form into a plurality of parallel segments.

13. The method of claim 12, wherein partitioning comprises a coarsening phase, an initial partitioning phase, and an uncoarsening and refinement phase.

14. The method of claim 12, further comprising:
    adding a message passing instruction to the plurality of parallel segments.

15. The method of claim 14, further comprising:
    generating routing instructions for the message passing instruction to traverse a multiprocessor system.

16. The method of claim 11, further comprising:
    allocating storage for variables associated with the intermediate form.

17. The method of claim 1, wherein the parsed cycle-based design models a logic design as an object-oriented data structure having reference objects and instance objects, the reference objects providing static attributes, the instance objects providing attributes of at least one point of invocation, and wherein a plurality of the instance objects share the attributes of one of the reference objects.

18. The method of claim 4, further comprising:
    combining the plurality of variables into a single variable.

19. The method of claim 11, wherein applying predicates for control conversion comprises:
    eliminating at least one internal branch in the intermediate form.

20. The method of claim 1, wherein converting the intermediate form to the executable form further comprises:
    recognizing a three state subset of a four state logic computation; and
    producing executable code specialized for the three state subset.

21. The method of claim 1, wherein converting the intermediate form to the executable form further comprises:
    recognizing a two state subset of a four state logic computation; and
    producing executable code specialized for the two state subset.

22. The method of claim 1, wherein the cycle-based design models a design net having multiple driving sources, further comprising:
    inserting a phantom gate, wherein the phantom gate resolves multiple signal logic states.

23. The method of claim 1, further comprising:
    levelizing the annotated syntax tree; and
    sorting the annotated syntax tree.

24. The method of claim 23, wherein sorting allows a single evaluation of logical components.

25. The method of claim 23, wherein sorting comprises:
    sorting the annotated syntax tree into a clock logic design class, a sequential logic design class, and a combinatorial logic design class.

26. The method of claim 1, wherein elaborating comprises:
    examining a plurality of modules;
    marking any module used by any other module as a child module; and identifying a root module candidate, if one of the plurality of modules is unmarked.

27. The method of claim 1, wherein the cycle-based design comprises a plurality of design logic instructions.

28. The method of claim 27, wherein the compiler partitions the design logic instructions among a plurality of memory elements in a hardware simulation system.

29. The method of claim 1, wherein the cycle-based design has a plurality of bit level operations, and wherein the compiler generates executable code to evaluate the plurality of bit level operations simultaneously.

30. The method of claim 1, further comprising:
detecting a procedure call outside the cycle-based design; and
recording in a data structure required at run time to interpret the procedure call.

31. A computer implemented method for compiling a cycle-based design in a simulation system comprising:
generating a parsed cycle-based design from the cycle-based design;
elaborating the parsed cycle-based design to an annotated syntax tree of component objects constituting the cycle-based design;
translating the annotated syntax tree to an intermediate form;
converting the intermediate form to an executable form;
representing the cycle-based design in an annotated symbol table;
levelizing the annotated syntax tree;
sorting the annotated syntax tree;
detecting a procedure call outside the cycle-based design; and
recording in a data structure required at run time to interpret the procedure call.

32. A computer implemented method for compiling a cycle-based design in a simulation system comprising:
generating a parsed annotated syntax tree of component objects constituting the cycle-based design;
inferring a logic type from parsed annotated syntax tree for each of a plurality of logic components;
elaborating the plurality of logic components to construct a design logic comprising a hierarchical design tree and a flattened design connectivity;
levelizing the design logic to schedule execution order of logical components using the flattened design connectivity;
translating the parsed annotated syntax tree and levelized flattened design connectivity into an intermediate form operation;
assigning each intermediate form operation to an execution processor;
ordering of the intermediate form operation within the assigned execution processor;
generating routing instructions for a message passing instruction to traverse a multiprocessor system;
converting the intermediate form operation into an annotated symbol table; and
converting the intermediate operation into executable form.

33. The method of claim 32, wherein the cycle-based design represents a hardware description language.

34. The method of claim 33, wherein the hardware description language comprises a hierarchical collection of modules.

35. The method of claim 33, wherein the hardware description language is Verilog.

36. The method of claim 32, wherein the logic type comprises clock logic, sequential logic, data logic, and initial logic.

37. A computer implemented method for levelization of a cycle-based design in a simulation system, comprising
collecting a plurality of simulated components by a logic type;
identifying a design constraint violation in the cycle-based design; and
sorting the plurality of simulated components according to the logic type into a component list;
wherein sorting determines an execution order of the plurality of simulated components whereby each of the plurality of simulated components are evaluated only once per simulation clock cycle.

38. The method of claim 37, further comprising:
correcting the cycle-based design if the design constraint violation is identified in the cycle-based design.

39. The method of claim 37, wherein the logic type comprises clock logic, sequential logic, data logic, and initial logic.

40. A compiler on a computer based simulation system comprising:
a design analyzer configured to generate a parsed cycle-based design from a cycle-based design;
a design elaborator configured to expand the parsed cycle-based design to an annotated syntax tree of component objects constituting the cycle-based design;
a translator configured to translate the annotated syntax tree to a language independent intermediate form; and
a code generator configured to convert the intermediate form to an executable form.

41. The compiler of claim 40, wherein the cycle-based design is represented as a hierarchical collection of modules.

42. The compiler of claim 41, wherein a plurality of variables at different levels of the hierarchical collection of modules represent a common variable.

43. The compiler of claim 40, wherein the cycle-based design is written in a hardware description language.

44. The compiler of claim 43, wherein the hardware description language is Verilog.

45. The compiler of claim 40, wherein the cycle-based design represents a clocked logic design having at least one periodic clock source.

46. The compiler of claim 43, wherein the cycle-based design allows an initialization of a variable defined by the hardware description language.

47. The compiler of claim 46, wherein the initialization of the variable is performed by an external control system.

48. The compiler of claim 46, wherein a value assigned to the variable automatically propagates to at least one dependent variable.

49. The compiler of claim 40, further comprising:
an annotated symbol table configured to represent the cycle-based design.

50. The compiler of claim 49, further comprising:
an external control system configured to be used with the annotated symbol table.

51. The compiler of claim 40, wherein the code generator further comprises:
a control flow converter configured to transform the intermediate form into a straight-line process;
a node mapper configured to map at least one node of the intermediate form to an operation of an execution processor;
a flow optimizer configured to apply flow optimization to the intermediate form;

a scheduler configured to schedule a sequence of a plurality of instructions associated with the intermediate form;

an instruction mapper configured to map intermediate form operations of the intermediate form to instructions of the execution processor; and an assembler configured to assemble instructions for the execution processor.

52. The compiler of claim 51, further comprising:

a partitioner configured to partition the intermediate form into a plurality of parallel segments.

53. The compiler of claim 52, wherein the partitioner uses a multilevel approach comprising a coarsening phase, an initial partitioning phase, and an uncoarsening and refinement phase.

54. The compiler of claim 51, further comprising:

message passing instructions configured to be added to the segments.

55. The compiler of claim 54, further comprising:

routing instructions configured to be generated for the messages to traverse a multiprocessor system.

56. The compiler of claim 51 further comprising:

storage for variables associated with the intermediate form configured to be allocated.

57. The compiler of claim 40, wherein the parsed cycle-based design models a logic design as an object-oriented data structure having reference objects and instance objects, the reference objects providing static attributes, the instance objects providing attributes of at least one point of invocation, and wherein a plurality of the instance objects share the attributes of one of the reference objects.

58. The compiler of claim 40, wherein the cycle-based design models a design net having multiple driving sources, further comprising:

a phantom gate configured to be inserted, wherein the phantom gate resolves multiple signal logic states.

59. The compiler of claim 40, wherein the elaborator comprises:

an examiner configured to examine a plurality of modules;

a marker configured to mark at least one child module;

a root module configured to be identified, if one of the plurality of modules is unmarked; and a determiner configured to determine a hierarchical depth of a plurality of unmarked modules, if more than one of the plurality of modules is unmarked.

60. The compiler of claim 40, wherein the cycle-based design represents a memory.

61. The compiler of claim 60, wherein the compiler partitions the memory among a plurality of memory elements in a target system.

62. The compiler of claim 40, wherein the cycle-based design has a plurality of bit level operations, and wherein the compiler generates executable code to evaluate the plurality of bit level operations simultaneously.

63. A computer based simulation system to compile a cycle-based design, comprising:

a processor;

a memory;

an input means;

a display device; and software instructions stored in the memory for enabling the computer system under control of the processor, to perform:

generating a parsed cycle-based design from the cycle-based design;

elaborating the parsed cycle-based design to an annotated syntax tree of component objects constituting the cycle-based design;

translating the annotated syntax tree to an intermediate form; and converting the intermediate form to an executable form.

64. A computer based simulation system to compile a cycle-based design, comprising:

a processor;

a memory;

an input means;

a display device; and software instructions stored in the memory for enabling the computer system under control of the processor, to perform:

generating a parsed annotated syntax tree of component objects constituting the cycle-based design;

inferring a logic type from parsed annotated syntax tree for each of a plurality of logic components;

elaborating the plurality of logic components to construct a design logic comprising a hierarchical design tree and a flattened design connectivity;

levelizing the design logic to schedule execution order of logical components using the flattened design connectivity;

translating the parsed annotated syntax tree and levelized flattened design connectivity into an intermediate form operation;

assigning each intermediate form operation to an execution processor;

ordering of the intermediate form operation within the assigned execution processor;

generating routing instructions for a message passing instruction to traverse a multiprocessor system;

converting the intermediate form operation into an annotated symbol table; and converting the intermediate operation into executable form.

65. A computer based simulation system for levelization of a cycle-based design, comprising:

a processor;

a memory;

an input means;

a display device; and software instructions stored in the memory for enabling the computer system under control of the processor, to perform:

collecting a plurality of simulated components by a logic type;

identifying a design constraint violation in the cycle-based design; and sorting the plurality of simulated components according to the logic type into a component list;

wherein sorting determines an execution order of the plurality of simulated components whereby each of the plurality of simulated components are evaluated only once per simulation clock cycle.

66. An apparatus for compiling a cycle-based design in a simulation system comprising:

means for generating a parsed cycle-based design from the cycle-based design;

means for elaborating the parsed cycle-based design to an annotated syntax tree of component objects constituting the cycle-based design;

means for translating the annotated syntax tree to an intermediate form; and means for converting the intermediate form to an executable form.

67. An apparatus for compiling a cycle-based design in a simulation system comprising:
means for generating a parsed annotated syntax tree of component objects constituting the cycle-based design;
means for inferring a logic type from parsed annotated syntax tree for each of a plurality of logic components;
means for elaborating the plurality of logic components to construct a design logic comprising a hierarchical design tree and a flattened design connectivity;
means for levelizing the design logic to schedule execution order of logical components using the flattened design connectivity;
means for translating the parsed annotated syntax tree and levelized flattened design connectivity into an intermediate form operation;
means for assigning each intermediate form operation to an execution processor;
means for ordering of the intermediate form operation within the assigned execution processor;
means for generating routing instructions for a message passing instruction to traverse a multiprocessor system;
means for converting the intermediate form operation into an annotated symbol table; and
means for converting the intermediate operation into executable form.

68. An apparatus for levelization of a cycle-based design in a simulation system, comprising
means for collecting a plurality of simulated components by a logic type;
means for identifying a design constraint violation in the cycle-based design; and
means for sorting the plurality of simulated components according to the logic type into a component list;
wherein sorting determines an execution order of the plurality of simulated components whereby each of the plurality of simulated components are evaluated only once per simulation clock cycle.

* * * * *